(12) United States Patent
Abbott

(10) Patent No.: US 7,968,928 B2
(45) Date of Patent: *Jun. 28, 2011

(54) DRAM LAYOUT WITH VERTICAL FETS AND METHOD OF FORMATION

(75) Inventor: Todd R. Abbott, Boise, ID (US)

(73) Assignee: Micron Technology, Inc., Boise, ID (US)

(*) Notice: Subject to any disclaimer, the term of this patent is extended or adjusted under 35 U.S.C. 154(b) by 99 days.

This patent is subject to a terminal disclaimer.

(21) Appl. No.: 12/076,766

(22) Filed: Mar. 21, 2008

(65) Prior Publication Data

US 2008/0237776 A1    Oct. 2, 2008

Related U.S. Application Data

(63) Continuation of application No. 10/928,315, filed on Aug. 30, 2004, now Pat. No. 7,365,385.

(51) Int. Cl.
*H01L 27/108* (2006.01)
*H01L 29/76* (2006.01)
*H01L 29/94* (2006.01)
*H01L 31/119* (2006.01)

(52) U.S. Cl. ................................ 257/302; 257/301

(58) Field of Classification Search .......... 257/295–310, 257/328–331, E27.057, E27.058, E27.096
See application file for complete search history.

(56) References Cited

U.S. PATENT DOCUMENTS

| | | | |
|---|---|---|---|
| 4,700,328 A | 10/1987 | Burghard | |
| 5,497,017 A | 3/1996 | Gonzales | |
| 5,677,221 A | 10/1997 | Tseng | |
| 5,831,912 A | 11/1998 | Mueller et al. | |
| 6,004,844 A | 12/1999 | Alsmeier et al. | |
| 6,072,209 A | 6/2000 | Noble et al. | |
| 6,339,239 B1 | 1/2002 | Alsmeier et al. | |
| 6,407,434 B1 | 6/2002 | Rostoker et al. | |
| 6,594,173 B2 | 7/2003 | Keeth | |
| 6,909,139 B2 | 6/2005 | Shum et al. | |
| 7,378,702 B2 * | 5/2008 | Lee | 257/296 |
| 2006/0017088 A1 * | 1/2006 | Abbott et al. | 257/302 |

OTHER PUBLICATIONS

W.F. Richardson, et al., "A Trench Transistor Cross-Point DRAM Cell," IEDM Technical Digest, pp. 714-717 (1985).

* cited by examiner

*Primary Examiner* — Cuong Q Nguyen
(74) *Attorney, Agent, or Firm* — Dickstein Shapiro LLP

(57) ABSTRACT

DRAM cell arrays having a cell area of less than about 4 $F^2$ comprise an array of vertical transistors with buried bit lines and vertical double gate electrodes. The buried bit lines comprise a silicide material and are provided below a surface of the substrate. The word lines are optionally formed of a silicide material and form the gate electrode of the vertical transistors. The vertical transistor may comprise sequentially formed doped polysilicon layers or doped epitaxial layers. At least one of the buried bit lines is non-orthogonal to at least one of the vertical gate electrodes of the vertical transistors.

16 Claims, 15 Drawing Sheets

DRAM LAYOUT WITH VERTICAL FETS AND METHOD OF FORMATION

CROSS-REFERENCE TO RELATED APPLICATION

This application is a continuation of U.S. patent application Ser. No. 10/928,315, filed on Aug. 30, 2004, now U.S. Pat. No. 7,365,385 the subject matter of which is incorporated in its entirety by reference herein.

FIELD OF THE INVENTION

The invention relates to improved semiconductor structures for high density device arrays and, in particular, to memory cell arrays and processes for their formation.

BACKGROUND OF THE INVENTION

There are two major types of random-access memory cells: dynamic and static. Dynamic random-access memories (DRAMs) can be programmed to store a voltage which represents one of two binary values, but require periodic reprogramming or "refreshing" to maintain this voltage for more than very short time periods. Static random-access memories are named "static" because they do not require periodic refreshing.

DRAM memory circuits are manufactured by replicating millions of identical circuit elements, known as DRAM cells, on dies on a single semiconductor wafer. Each DRAM cell is an addressable location that can store one bit (binary digit) of data. In its most common form, a DRAM cell consists of two circuit components: a field effect transistor (FET) and a capacitor.

FIG. 1 illustrates a portion of an exemplary DRAM memory circuit containing two neighboring DRAM cells 42. For each cell, capacitor 44 has two connections, located on opposite sides of the capacitor 44. The first connection is to a reference voltage, which is typically one half of the internal operating voltage (the voltage corresponding to one logical state) of the circuit. The second connection is to the drain of the FET 46. The gate of the FET 46 is connected to the word line 48, and the source of the FET is connected to the bit line 50. This connection enables the word line 48 to control access to the capacitor 44 by allowing or preventing a signal (a logic "0" or a logic "1") on the bit line 50 to be written to, or read from, the capacitor 44. In some arrangements, the body of the FET 46 is connected to body line 76, which is used to apply a fixed potential to the semiconductor body.

The manufacturing of a DRAM cell typically includes the fabrication of a transistor, a capacitor, and three contacts: one each to the bit line, the word line, and the reference voltage Vr. As DRAM manufacturing is a highly competitive business, there is continuous pressure to decrease the size of individual cells and to increase memory cell density to allow more memory to be squeezed onto a single memory chip, especially for densities greater than 256 Megabits. Limitations on cell size reduction include the passage of both active and passive word lines through the cell, the size of the cell capacitor, and the compatibility of array devices with non-array devices.

Conventional folded bit line cells of the 256 Mbit generation with planar devices have a size of at least 8 $F^2$, where F is the minimum lithographic feature size. If a folded bit line is not used, the cell may be reduced to 6 or 7 $F^2$. To achieve a smaller size, vertical devices could be used. In this manner, cell sizes of 4 $F^2$ may be achieved by using vertical transistors stacked either below or above the cell capacitors, as in the "cross-point cell" of W. F. Richardson et al., *A Trench Transistor Cross-Point DRAM Cell*, IEDM Technical Digest, pp. 714-17 (1985). Known cross-point cells, which have a memory cell located at the intersection of each bit line and each word line, are expensive and difficult to fabricate because the structure of the array devices is typically incompatible with that of non-array devices. Other known vertical cell DRAMs using stacked capacitors have integration problems due to the extreme topography of the capacitors.

There is needed, therefore, a DRAM cell having an area of less than about 4 $F^2$ that achieves high array density while maintaining structural commonality between array and peripheral (non-array) features. Also needed are simple methods of fabricating a DRAM cell that maximizes common process steps during the formation of array and peripheral devices.

Additional advantages and features of the present invention will be apparent from the following detailed description and drawings which illustrate preferred embodiments of the invention.

SUMMARY OF THE INVENTION

Exemplary embodiments of the present invention provide a DRAM cell array capable of achieving a cell area of less than about 4 $F^2$ which comprises an array of vertical transistors with at least one buried bit line and at least one vertical gate electrode. The buried bit line and the vertical gate electrode of the vertical transistors are substantially non-orthogonal. Also provided are processes for fabricating DRAM cell arrays with vertical FET transistors having buried bit lines and vertical gate electrodes.

DETAILED DESCRIPTION OF THE INVENTION

In the following detailed description, reference is made to various specific embodiments in which the invention may be practiced. These embodiments are described with sufficient detail to enable those skilled in the art to practice the invention, and it is to be understood that other embodiments may be employed, and that structural and logical changes may be made without departing from the spirit or scope of the present invention.

The term "substrate" in the following description may include any semiconductor-based structure on or at the surface of which circuitry may be formed. The structure should be understood to include silicon, silicon-on insulator (SOI), silicon-on-sapphire (SOS), doped and undoped semiconductors, epitaxial layers of silicon supported by a base semiconductor foundation, and other semiconductor structures. The semiconductor need not be silicon-based. The semiconductor could be silicon-germanium, germanium, or gallium arsenide. When reference is made to the substrate in the following description, previous process steps may have been utilized to form regions or junctions on or over the base semiconductor or foundation.

The exemplary processes disclosed herein for the formation of memory cells having buried bit lines and vertical gate electrodes is the subject of U.S. patent application Ser. No. 10/894,125, filed Jul. 28, 2004, the disclosure of which is incorporated by reference herein. To fully understand the present invention, the processes described in that application are repeated in this application, as modified in accordance with the invention described and claimed herein.

The exemplary embodiments described below illustrate the formation of a DRAM cell having a cell size smaller than $4F^2$ (where F is the minimum lithographic feature size), more preferably of about $3.464 F^2$. The $3.464 F^2$ DRAM cell size is realizable through a novel "honeycomb" layout, which is a hexagonally-shaped layout that utilizes space efficiently, without sacrificing any lithography constraints. In the hexagonally-shaped layout of the present invention, at least one buried bit line and at least one word line of the DRAM cell are placed at an angle other than a ninety degree angle, preferably at an angle α of about 60 degrees in relation to each other. Thus, by changing the square layout of a DRAM cell (such as the one described in U.S. patent application Ser. No. 10/894,125, filed Jul. 28, 2004 to a hexagonal layout, the $4 F^2$ cell size of a square layout becomes a $3.464 F^2$ cell size corresponding to the hexagonal layout.

Figure 11:
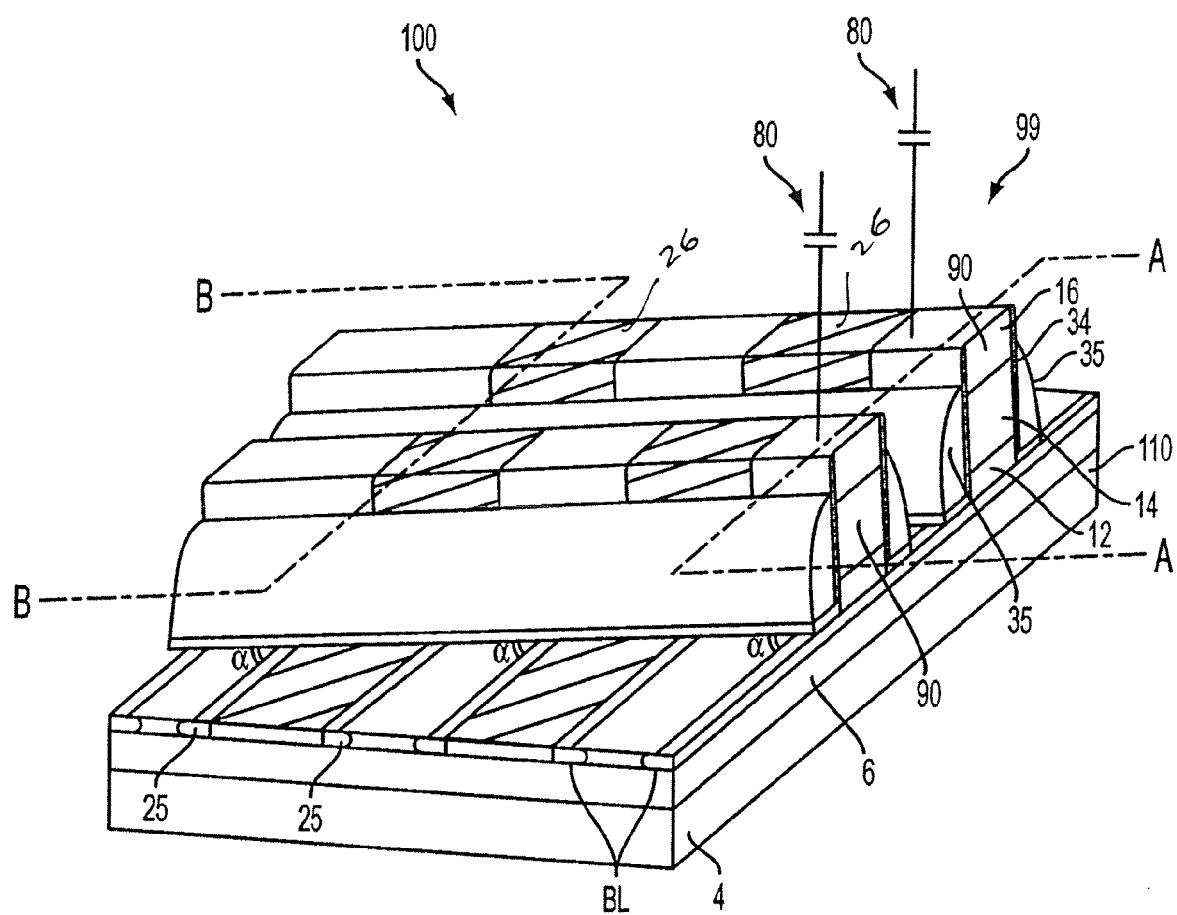
FIG. 11 is a perspective view of a memory array fabricated according to a first embodiment of the present invention.

Referring now to the drawings, where like elements are designated by like reference numerals, a portion of an embodiment of device array 100 of the present invention is illustrated in FIG. 11. The device array 100 comprises a plurality of DRAM cells 99 formed over or within a substrate, for example over the illustrated SOI substrate 110. Each DRAM cell 99 comprises two devices, a vertical transistor 90 and a capacitor 80 located above the vertical transistor 90 having one electrode electrically connected to transistor 90.

As described in detail below, each vertical transistor 90 of a particular column in the array 100 is formed of drain 16 and source 12, with double vertical gate electrode 35 formed over the thin gate oxide 34 of each transistor 90. The gate electrode is vertical and non-orthogonal to the buried bit line 25. The vertical gate electrode forms word line 35 which electrically connects all of the cells 99 of a given row in the array 100.

The vertical transistor 90 comprises a vertical stack of three doped silicon layers 12, 14 and 16 over an insulation layer 6. An exemplary N-channel transistor 90, as illustrated in FIG. 11, would be formed using a SOI substrate 110 of a second conductivity type, for example n-type, a source 12 of the second conductivity type (n+), a lightly-doped body region 14 of a first conductivity type (p−), and a drain 16 of the second conductivity type (n+). If P-channel devices were desired, the doping types and doping levels of these elements would be adjusted accordingly, as known in the art.

The vertical transistor 90 is a MOSFET (metal-oxide-semiconductor FET) device having doped region 12 coupled to a pair of buried bit lines (BL) 25. The drain 16 of the transistor 90 is in contact with one electrode of capacitor 80. The buried bit lines 25, preferably comprising a silicide material, are formed so that they contact the source 12 of each transistor 90 of a particular column in the array 100. A pair of active word lines 35 of a conductive material, such as doped polysilicon, of a second conductivity type (n+), is formed to act as the gate of each transistor 90, and to electrically connect all of the cells 99 of a given row in the array 100.

Figure 1:
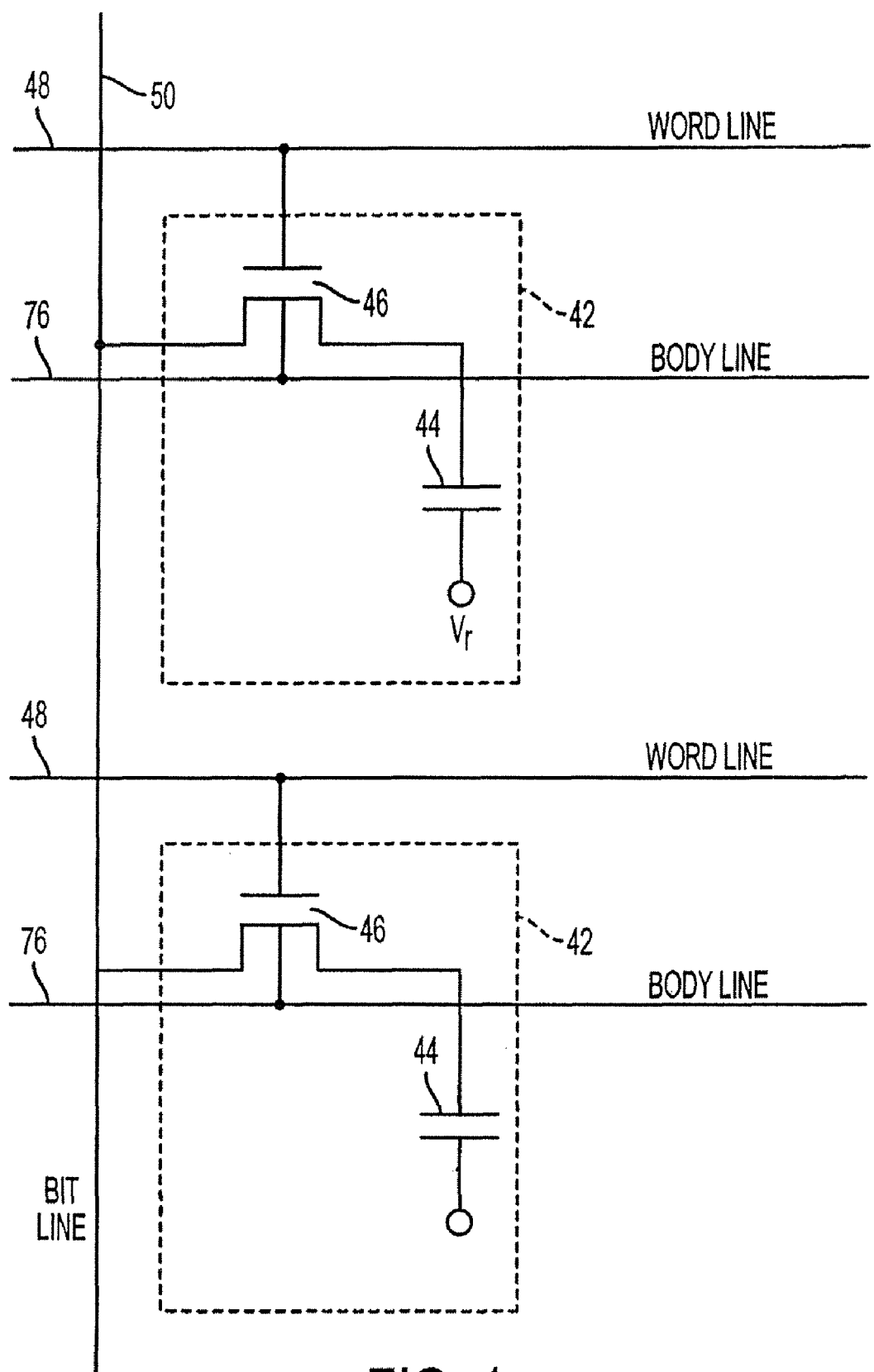
FIG. 1 is a schematic illustration of a known DRAM cell.
Figure 2:
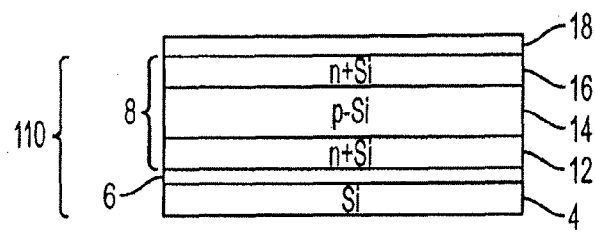
FIG. 2 is a cross-sectional view of a SOI substrate undergoing initial stages of a process according to a first embodiment of the present invention.

The device array 100 is manufactured through a process described as follows and illustrated in FIGS. 2-10. First, SOI substrate 110 is formed by known methods in the art, for example, separation by implanted oxygen (SIMOX), bonding and etching back (BESOI), and zone melting and recrystallization (ZMR), among others. According to the bonding and etching back method, the process for the formation of the SOI substrate 110 starts with the preparation of a silicon substrate 4 (FIG. 2). The silicon substrate 4 is thermally oxidized to grow a layer of silicon oxide 6 (FIG. 2) with a thickness of about 1 micron. Subsequently, a single crystalline silicon substrate 8 is opposed to the silicon oxide layer 6, as also shown in FIG. 2. In this manner, the silicon substrate 4, with the oxide layer 6, is contacted with the crystalline silicon substrate 8, and the resultant structure is heated to a temperature of about 1000° C. so that the crystalline silicon substrate 8 adheres to the silicon oxide layer 6. Thus, a resultant SOI substrate 110 (FIG. 2) is formed of the silicon substrate 4, the silicon oxide layer 6, and the crystalline silicon substrate 8.

Subsequent to the formation of the SOI substrate 110, device layers 12, 14, 16 are formed by implant doping of the crystalline silicon substrate 8 appropriately to form n+, p−, n+ regions or layers 12, 14, 16, as also shown in FIG. 2. Thus, the first device layer 12 (FIG. 2) is preferably a doped silicon layer of a second conductivity type (n+) approximately 0.4 microns thick, formed by implanting n-type dopants such as phosphorous (P), arsenic (As) or antimony (Sb) into crystalline silicon substrate 8 to form the n+ silicon layer 12. A heat treatment, such as an anneal treatment at about 600° C. to about 1000° C., may be optionally employed to activate the dopant within the n+ silicon layer 12. The second device layer 14 is preferably a lightly-doped silicon layer of a first conductivity type (p−); its thickness can be varied for desired channel lengths (e.g., about 0.05 to about 0.5 microns). The third device layer 16 is also preferably a doped silicon layer of a second conductivity type (n+) about 0.2 microns thick. A heat treatment may be also optionally employed to activate the dopants within the p− silicon layer 14 and the n+ silicon layer 16.

As also shown in FIG. 2, an insulating layer 18, preferably formed of a nitride or oxide material, is formed on top of the third device layer 16 by a deposition method or other suitable methods. The insulating layer 18 may be also formed of silicon dielectrics such as silicon nitride or silicon oxide, but TEOS or carbides may be used also. Preferably, insulating layer 18 comprises a nitride material formed via CVD, PECVD and LPCVD deposition procedures, for example, at a temperature between about 300° C. to about 1000° C., to a thickness of about 500 Angstroms to about 2,000 Angstroms.

Figure 3:
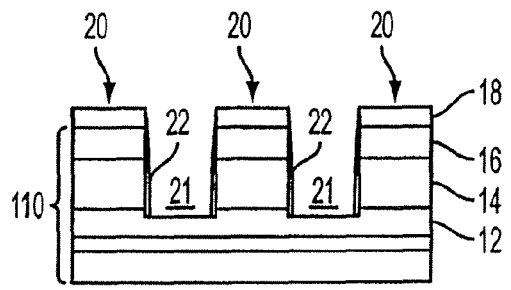
FIG. 3 shows the SOI substrate of FIG. 2 at a processing step subsequent to that shown in FIG. 2.

A photoresist and mask 801 (FIG. 38) are then applied over the insulating layer 18, and photolithographic techniques are used to define a set of parallel rows on the array surface. A directional etching process such as plasma etching or reactive ion etching (RIE) is used to etch through the insulating layer 18 and through the device layers 16, 14 and into device layer 12 to form a first set of trenches 21, as depicted in FIG. 3. Preferably, the first set of trenches 21 extends into the first device layer 12 about 1,000 Angstroms.

After removal of the resist, a nitride film 22 is formed on the sides of the first set of trenches 21 by depositing a layer of CVD nitride, for example, and directionally etching to remove excess nitride from horizontal surfaces. The nitride film 22 (FIG. 3), which is about 100 Angstroms thick, acts as an oxidation and etching barrier during subsequent steps in the fabrication process. Anisotropic etching such as RIE is subsequently conducted to deepen the first set of trenches 21 by about an additional 0.3 microns and to remove, therefore, the remainder of the n+ silicon layer 12.

Figure 4:
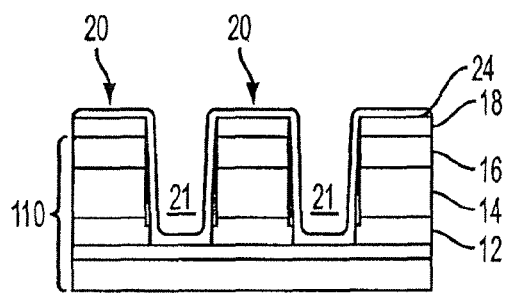
FIG. 4 shows the SOI substrate of FIG. 2 at a processing step subsequent to that shown in FIG. 3.
Figure 5:
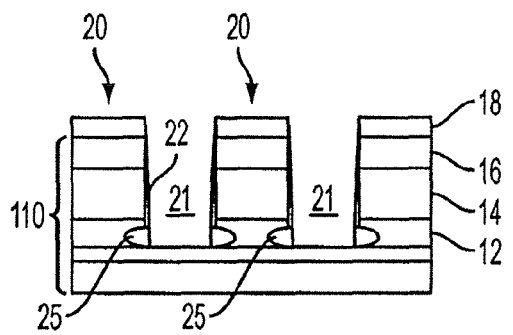
FIG. 5 shows the SOI substrate of FIG. 2 at a processing step subsequent to that shown in FIG. 4.

Next, as shown in FIG. 4, a conductive layer 24 of a metal capable of forming a silicide is formed over gate stacks 20, over the nitride spacers 22 and within the first set of trenches 21 by RF or DC sputtering, or by other similar methods such as CVD, to a thickness of about 100 Angstroms to about 800 Angstroms. Subsequent to the deposition of the metal capable of forming a silicide, the substrate is subjected to a rapid thermal anneal (RTA), typically for about 10 to 60 seconds, using a nitrogen ambient at about 600° C. to about 850° C., so that the metal in direct contact with the doped silicon layer 12 is converted to its silicide and forms buried silicide regions 25 (which are the buried bit lines 25 of the device array 100 of FIG. 11). Preferably, the metal capable of forming a silicide is a combination of cobalt/titanium nitride material that forms cobalt silicide bit line 25. However, the metal silicide may comprise any metal capable of forming a silicide, including but not limiting to cobalt, nickel, molybdenum, titanium, tungsten, tantalum, and platinum, among others, and combinations of such materials. In addition, the metal silicide may also comprise combinations of silicides doped with nitrogen, such as cobalt nitride silicide, tungsten nitride silicide, or a combination of tungsten nitride silicide/tungsten silicide, for example.

Figure 6:
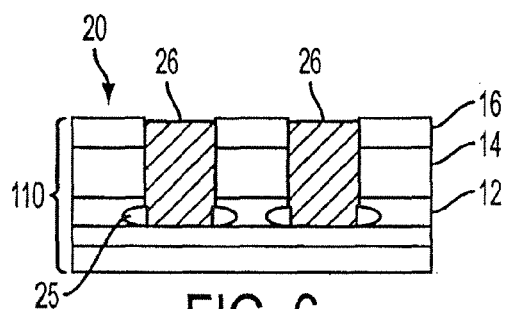
FIG. 6 shows the SOI substrate of FIG. 2 at a processing step subsequent to that shown in FIG. 5.

Subsequent to the formation of buried silicide bit lines 25, the unreacted metal is stripped, together with the protective nitride spacers 22 (FIG. 5) and the insulating layer 18 (FIG. 5), and nitride material 26 is formed within the first set of trenches 21 (FIG. 6). Although nitride material 26 is preferred, the invention also contemplates the formation of an oxide, such as silicon oxide for example, to fill in the first set of trenches 21. The device array 100 is then planarized by any suitable means, such as chemical mechanical polishing (CMP), stopping at the third device layer 16.

Reference is now made to FIGS. 7-10 which schematically illustrate the formation of word lines 35 (FIG. 10) of the vertical transistors 90 (FIG. 11). For a better understanding of the formation of word lines 35, FIGS. 7-10 are illustrated as side-to-side cross-sectional views of the device array 100 of FIG. 11, taken along lines A-A and B-B and at an initial stage of processing, but subsequent to the formation of the silicide bit lines 25 described above. The illustrations in FIGS. 7-10 are cross-sectional views taken normal to the buried bit lines 25 (A-A), but at two different locations of the array 100 (A-A) and (B-B).

Figure 7:
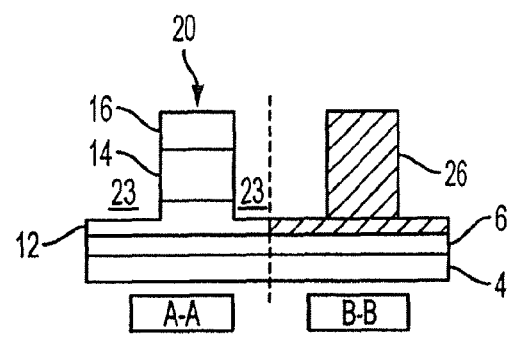
FIG. 7 shows two side-to-side cross-sectional views (A-A and B-B) of a SOI substrate of FIG. 11 undergoing the process according to the first embodiment of the present invention and at a processing step subsequent to that shown in FIG. 6.

FIG. 7 (A-A) illustrates stack 20 after the formation of the silicide bit lines 25 of FIG. 6 and after the formation of a second set of trenches 23. The formation of the second set of trenches 23 is similar to the formation of the first set of trenches 21 (FIG. 3). Accordingly, a photoresist and mask 802 (FIG. 38) are applied over the third device layer 16, and photolithographic techniques are used to define a set of parallel columns on the array surface. A directional etching process such as plasma etching or reactive ion etching (RIE) is used to etch through layer 26, the device layers 16, 14 and stopping on device layer 12 to form the second set of trenches 23, as depicted in FIG. 7.

Figure 8:
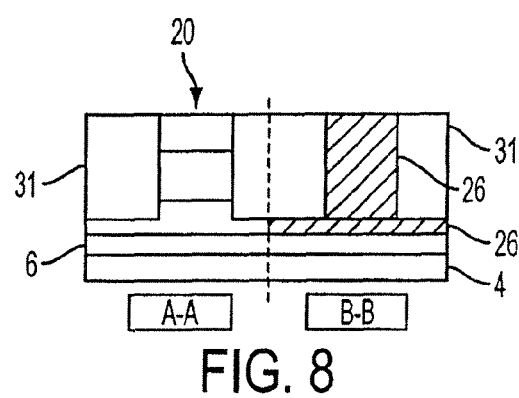
FIG. 8 shows the SOI substrate of FIG. 7 at a processing step subsequent to that shown in FIG. 7.
Figure 9:
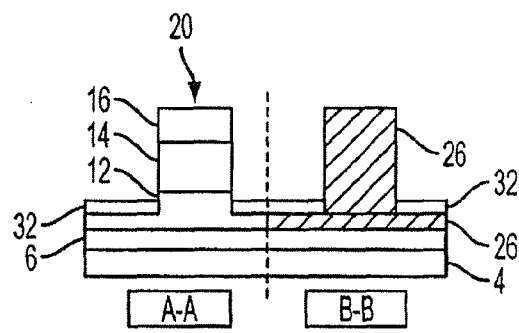
FIG. 9 shows the SOI substrate of FIG. 7 at a processing step subsequent to that shown in FIG. 8.
Figure 10:
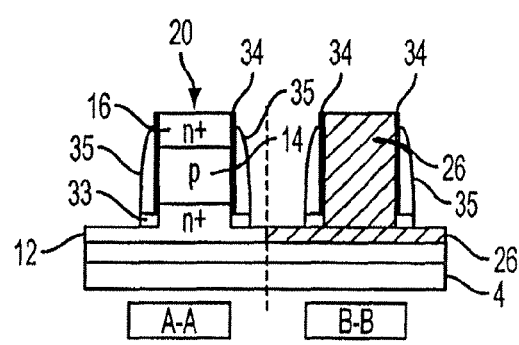
FIG. 10 shows the SOI substrate of FIG. 7 at a processing step subsequent to that shown in FIG. 9.

FIG. 8 illustrates the next step in the process, in which the second set of trenches 23 (FIG. 7) are filled with an insulating material 31, preferably an oxide material such as silicon oxide, which is etched back by known methods in the art to form oxide layer 32, as shown in FIG. 9. The height of the oxide layer 32 is tailored to allow isolation of the already-formed silicide bit lines 25 from the to-be-formed word lines or gate electrodes 35. Subsequent to the formation of the oxide layer 32, a thin gate oxide layer 34 and a gate electrode 35 are sequentially formed on the sidewalls of the stacks 20, as shown in FIG. 10. The thin gate oxide layer 34, which will act as a gate insulator layer, may comprise silicon dioxide ($SiO_2$), for example, which may be thermally grown in an oxygen ambient, at a temperature between about 600° C. to about 1000° C. and to a thickness of about 10 Angstroms to about 100 Angstroms. The gate insulator is not limited to silicon oxide and other dielectric materials such as oxynitride, $Al_2O_3$, $Ta_2O_5$ or other high k material may be used as gate insulator layer.

As illustrated in FIG. 10, a gate layer 35 is formed over the thin gate oxide layer 34. According to an embodiment of the present invention, the gate layer 35 is formed of doped polysilicon, for example, which may be deposited over the thin gate oxide layer 34 by, for example, a low plasma chemical vapor deposition (LPCVD) method at a temperature of about 300° C. to about 700° C. and to a thickness of about 100 Angstroms to about 2,000 Angstroms. Anisotropic plasma etching is conducted to define the gate electrode 35 non-orthogonal to the buried silicide bit lines 25. For example, the gate electrode 35 is formed at an angle α (FIG. 11), preferably of about 60 degrees, with the bit lines 25. Subsequent processing steps are then applied to complete the formation of the device array 100 comprising MOSFET transistors 90. Each of the vertical transistor 90 of a particular column in the array 100 is formed of drain 16 and source 12, with double vertical gate electrode 35 formed over the thin gate oxide 34 of each transistor 90. The gate electrode is vertical and non-orthogonal to the buried bit line 25. In an exemplary embodiment, the double vertical gate electrode 35 forms an angle α of about 60 degrees with the buried bit line 25. The vertical gate electrode forms word line 35 which electrically connects all of the cells 99 of a given row in the array 100.

Conventional processing methods may then be used to form contacts and wirings to connect the device array to peripheral circuits, and to form other connections. For example, the entire surface may be covered with a passivation layer of, for example, silicon dioxide, BSG, PSG, or BPSG, which is CMP planarized and etched to provide capacitor trenches over the transistors 90, in which capacitors 80 are formed, as well as contact holes which may then be metallized to interconnect the word lines, bit lines and capacitors 80 of the memory cells 99 into an operative memory array. Conventional multiple layers of conductors and insulators may also be used to interconnect the structures.

Figure 17:
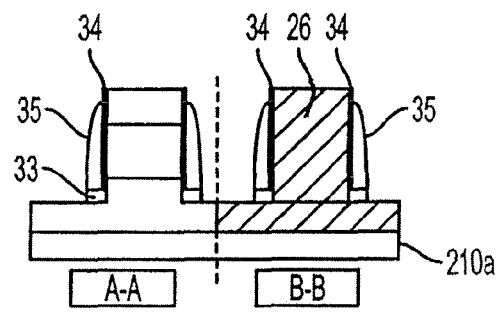
FIG. 17 shows two side-to-side cross-sectional views (A-A and B-B) of a semiconductor wafer of FIG. 18 undergoing the process according to the second embodiment of the present invention and at a processing step subsequent to that shown in FIG. 16.
Figure 15:
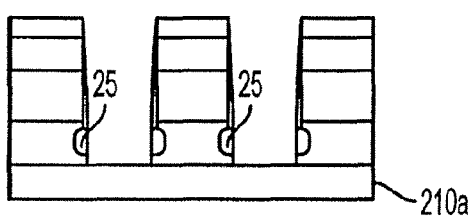
FIG. 15 shows the wafer of FIG. 12 at a processing step subsequent to that shown in FIG. 14.
Figure 18:
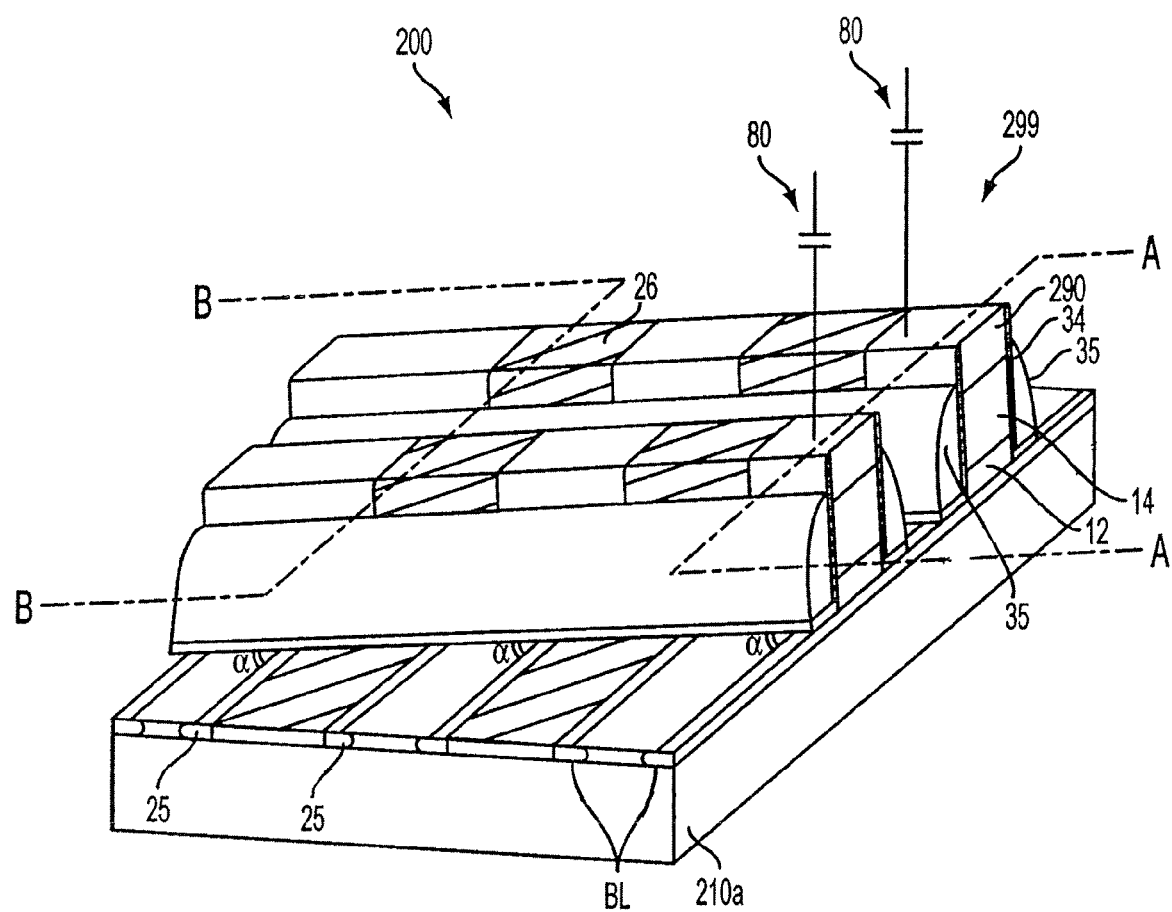
FIG. 18 is a perspective view of a memory array fabricated according to a second embodiment of the present invention.

Reference is now made to FIGS. 12-18 which illustrate the formation of device array 200 (FIG. 18) in accordance with a second embodiment of the present invention. In this embodiment, the device array 200 comprises a plurality of DRAM cells 299 formed over or within a p-type wafer substrate 210, and not within a SOI substrate, such as the SOI substrate 110 of the previously-described embodiment. As in the first embodiment, and as shown in FIG. 18, each DRAM cell 299 comprises two devices, a vertical transistor 290 and a capacitor 80 located above the transistor 290. The gate layer 35 is vertical and non-orthogonal to the buried bit line 25 formed within the p-type substrate 210.

The transistor 290 is formed of a vertical stack of three doped silicon layers formed by appropriately doping the p-type wafer substrate 210. An exemplary n-channel device, as illustrated in FIG. 18, would be formed using a wafer substrate 210 of a first conductivity type, for example p+, a source 12 of a second conductivity type (n+), a lightly-doped body region 14 of a first conductivity type (p−), and a drain 16 of a second conductivity type (n+). If p-channel devices were desired, the doping types and levels of these elements would be adjusted accordingly, as known in the art. The drain 16 of the transistor 290 is in contact with one electrode of capacitor 80. Buried silicide bit line 25 is formed of a conductive silicide and contacts the source 12 of each transistor 290 of a particular column in the array 200. Active word line or gate electrode 35 is formed of a conductive material such as doped polysilicon of a second conductivity type (n+) and acts as the gate of each transistor 290 to electrically connect all of the cells 299 of a given row in the array 200.

FIGS. 12-17 illustrate the processing steps for the formation of the device array 200 manufactured in accordance with a second embodiment of the present invention. As noted above, these processing steps are similar in part with the processing steps of FIGS. 2-10 but differ in that the SOI substrate 110 of the first embodiment is replaced with a p-type substrate 210 in the second embodiment. Accordingly, for exemplary purposes only, the substrate 210 will be described as a silicon substrate, and the following process should be modified as appropriate and as known in the art if a non-silicon substrate is used. The substrate 210 may be doped or undoped, but a p-type doped substrate is preferred. For example, substrate 210 may be a doped silicon substrate having an active dopant concentration within the range of about $1 \times 10^{16}$ to $1 \times 10^{18}$ atoms per $cm^3$, more preferably about $5 \times 10^{16}$ to $5 \times 10^{17}$ atoms per $cm^3$.

Device layers 12, 14, 16 are next formed by doping or implanting areas of the p-type substrate 210 appropriately with p-type or n-type dopants to form n+, p−, n+ regions or layers 12, 14, 16. In this manner, the first device layer 12 is preferably formed as a doped silicon layer of a second conductivity type (n+) and about 0.4 microns thick, by implanting n-type dopants such as phosphorous (P), arsenic (As) or antimony (Sb) into p-type substrate 210 to form the n+ silicon layer 12. The second device layer 14 is preferably formed as a lightly-doped silicon layer of a first conductivity type (p−) and has a thickness that can be varied for desired channel length (e.g., about 0.05 to about 0.5 microns). The third device layer 16 is preferably formed as a doped silicon layer of a second conductivity type (n+) about 0.2 microns thick. A heat treatment, such as an anneal treatment at about 600° C. to about 1000° C., may be optionally used to activate the dopants within the n+ silicon layer 12, the p– silicon layer 14 and the n+ silicon layer 16. The remaining portion of the substrate 210 is illustrated in FIG. 12 as substrate 210a.

Figure 12:
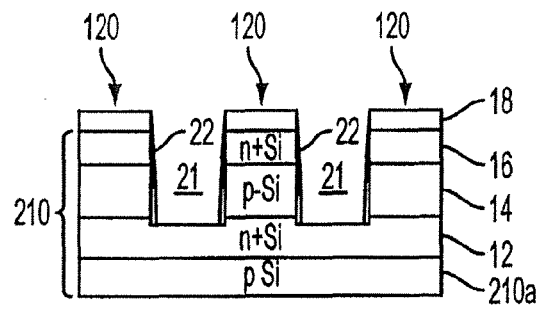
FIG. 12 is a cross-sectional view of a wafer substrate undergoing the process according to a second embodiment of the present invention.
Figure 16:
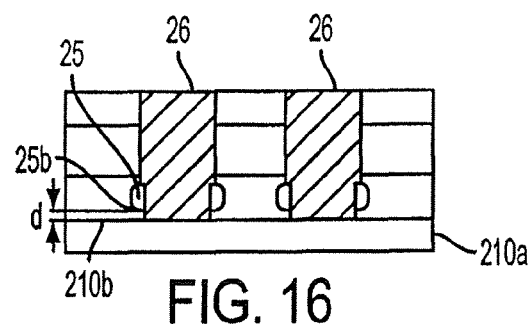
FIG. 16 shows the wafer of FIG. 12 at a processing step subsequent to that shown in FIG. 15.

As also shown in FIG. 12, an insulating layer 18, preferably formed of a nitride or oxide material, is formed on top of the third device layer 16 by chemical vapor deposition (CVD) or other suitable methods. A photoresist and mask 801 (FIG. 38) are then applied over the first insulating layer 18, and photolithographic techniques are used to define a set of parallel rows on the array surface. A directional etching process such as plasma etching or reactive ion etching (RIE) is used to etch through the insulating layer 18 and through the device layers 14, 16 and into device layer 12 of the substrate 210 to form a first set of trenches 21, as depicted in FIG. 12. Preferably, the first set of trenches 21 extends into the first device layer 12 about 1,000 Angstroms.

After removal of the resist, a nitride film 22 (FIG. 12) is formed on the sides of the first set of trenches 21 by depositing a layer of CVD nitride, for example, and directionally etching to remove excess nitride from horizontal surfaces. The nitride film 22, which is about 100 Angstroms thick, acts as an oxidation and etching barrier during subsequent steps in the fabrication process. Anisotropic etching such as RIE is subsequently conducted to deepen the first set of trenches 21 by about an additional 0.3 microns and to remove, therefore, the remainder of the n+ silicon layer 12.

Figure 13:
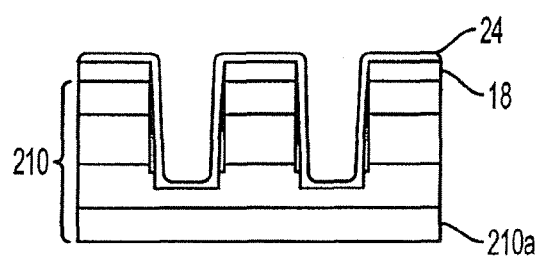
FIG. 13 shows the wafer of FIG. 12 at a processing step subsequent to that shown in FIG. 12.
Figure 14:
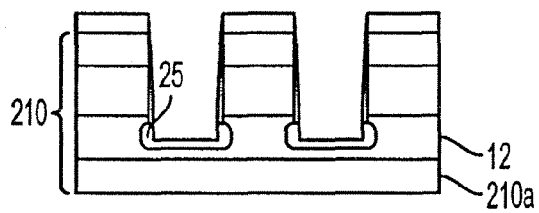
FIG. 14 shows the wafer of FIG. 12 at a processing step subsequent to that shown in FIG. 13.

A conductive layer 24 (FIG. 13) of a metal capable of forming a silicide is next formed over gate stacks 120, over the nitride spacers 22 and within the first set of trenches 21 (FIG. 13). The conductive layer 24 may be formed by RF or DC sputtering, or by other similar methods such as CVD, to a thickness of about 100 Angstroms to about 800 Angstroms. Subsequent to the deposition of the metal capable of forming a silicide, the substrate is subjected to a rapid thermal anneal (RTA), typically for about 10 to 60 seconds, using a nitrogen ambient at about 600° C. to about 850° C., so that the metal in direct contact with the doped silicon layers 12 is converted to its silicide and forms buried silicide regions 25 (FIG. 14, which will be the buried bit lines 25 of the device array 200 of FIG. 18). It must be noted, however, that no silicide forms within the p-type substrate 210a. Preferably, a distance "d" (FIG. 16) of about 700 Angstroms must be maintained between lower surface 25b of the buried bit lines 25 and upper surface 210b of the p-type substrate 210.

As in the previously-described embodiment, the metal capable of forming a silicide may preferably be a combination of cobalt/titanium nitride material that forms cobalt silicide bit line 25. However, the metal silicide may comprise any metal capable of forming a silicide, including but not limiting to cobalt, nickel, molybdenum, titanium, tungsten, tantalum, and platinum, among others, and combinations of such materials. In addition, the metal silicide may also comprise combinations of silicides doped with nitrogen, such as cobalt nitride silicide, tungsten nitride silicide, or a combination of tungsten nitride silicide/tungsten silicide, for example.

Subsequent to the formation of buried silicide bit lines 25, the unreacted metal is stripped, the silicide and device layer 12 is etched stopping on the substrate 210a together with the protective nitride spacers 22 (FIG. 15) and insulating layer 18 (FIG. 15), and a nitride material 26 (FIG. 16) is formed within the first set of trenches 21. Although nitride material is preferred, the invention also contemplates the formation of an oxide, such as silicon oxide for example, to fill in the first set of trenches 21. The device array 200 is then planarized by chemical mechanical polishing (CMP), for example, stopping at the third device layer 16.

Figure 38:
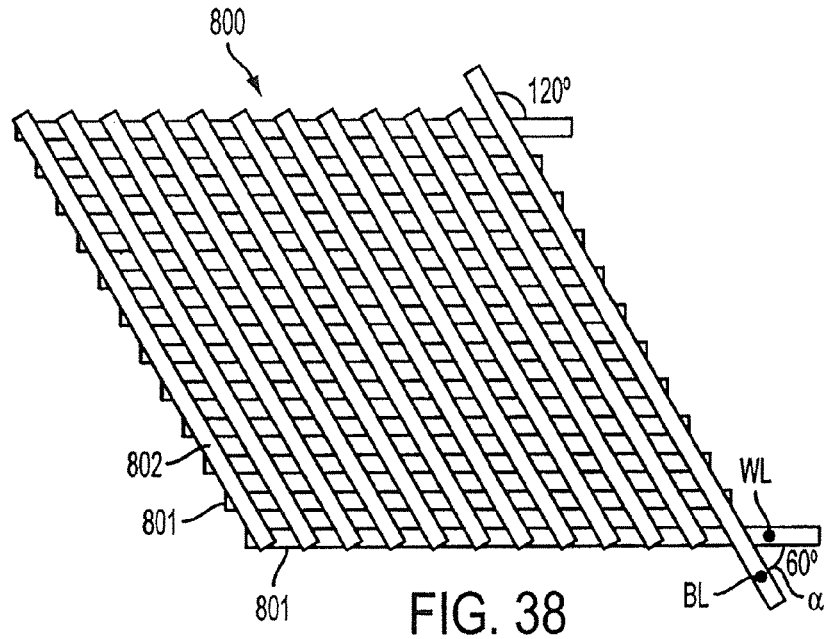
FIG. 38 is a top view of a mask array employed during the formation of the memory arrays fabricated according to the embodiments of the present invention.

Subsequent to the formation of the first set of trenches 21, a second set of trenches (FIG. 17) are formed by directional etching, for example, as explained above for trenches 23 with reference to FIGS. 7-10. Thus, the second set of trenches are formed by employing again mask 802 (FIG. 38). The second set of trenches are then filled with an insulating material, preferably an oxide material such as silicon oxide, which is etched back by known methods in the art to form an oxide layer (not shown) similar to oxide layer 32 of FIG. 9.

Subsequent to the formation of the oxide layer (which will be etched to form oxide regions 33 of FIG. 17), a thin gate oxide layer 34 and a gate electrode 35 are sequentially formed on the sidewalls of the stacks 20, as shown in FIG. 17. The thin gate oxide layer 34 and word lines or gate electrodes 35 (FIG. 17) of the vertical transistors 290 (FIG. 18) are formed as described above with reference to the formation of the word lines or gate electrodes of the first embodiment of the present invention. The thin gate oxide layer 34, which will act as a gate insulator layer, may comprise silicon dioxide ($SiO_2$), for example, which may be thermally grown in an oxygen ambient, at a temperature between about 600° C. to about 1000° C. and to a thickness of about 10 Angstroms to about 100 Angstroms. The gate insulator is not limited to silicon oxide and other dielectric materials such as oxynitride, $Al_2O_3$, $Ta_2O_5$ or other high k material may be used as gate insulator layer. Gate layer 35 may be formed of polysilicon which may be deposited over the thin gate oxide layer 34 by, for example, a low plasma chemical vapor deposition (LPCVD) method at a temperature of about 300° C. to about 700° C. and to a thickness of about 100 Angstroms to about 2,000 Angstroms.

Subsequent processing steps are then conducted to complete the formation of the device array 200 comprising MOSFET transistors 290. Each of the vertical transistor 290 of a particular row in the array 200 is formed of drain 16 and source 12, with gate layer 35 formed over the thin gate oxide 34 of each vertical transistor 290. The gate layer 35 is vertical and non-orthogonal to the buried bit line 25 formed within the p-type substrate 210a. For example, the gate layer 35 may form an angle α (FIG. 18) of about 60 degrees with the buried bit line 25. The vertical gate layer forms word line 35 which electrically connects all of the cells 299 of a given row in the array 200. Capacitors are formed over the vertical transistors 290 with one electrode in contact with drain 16. Other processing steps are then carried out to interconnect the word line, bit lines and capacitors of the memory cells 299 in a memory array, as described above with reference to the first embodiment.

Figure 19:
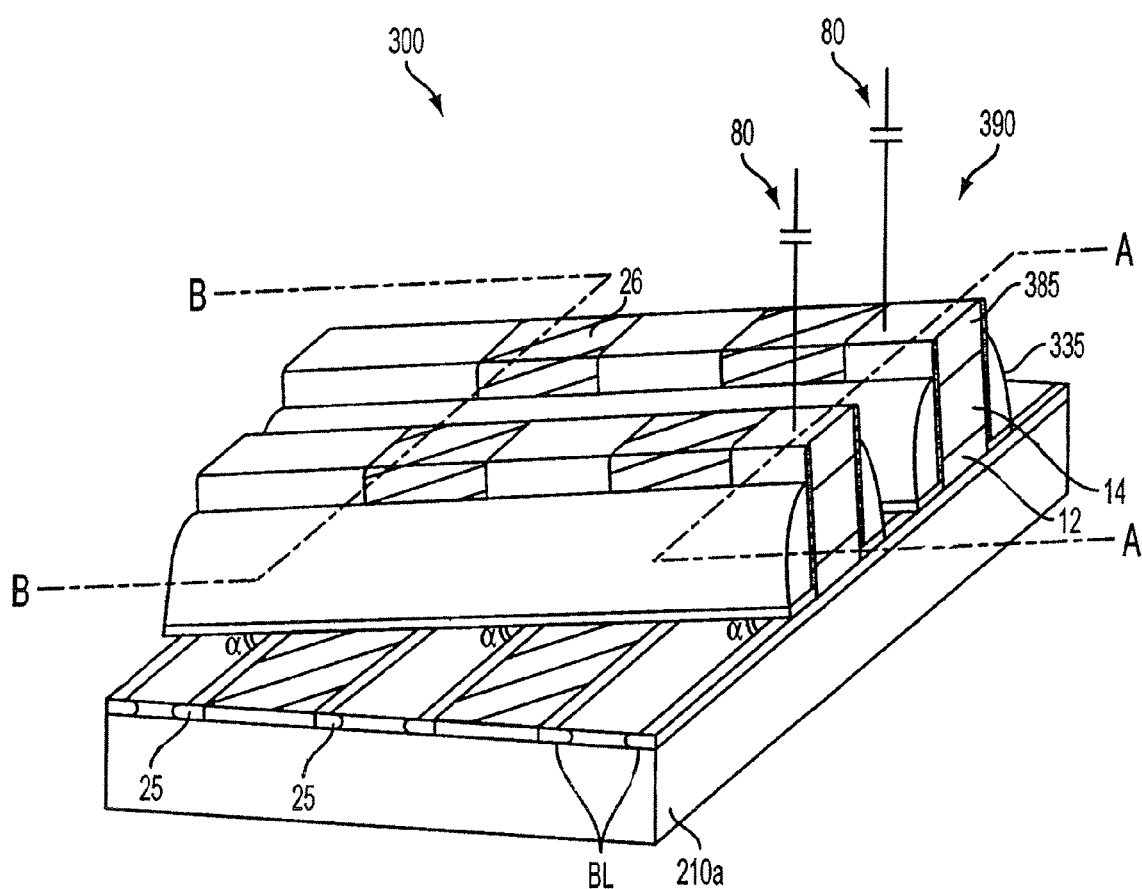
FIG. 19 is a perspective view of a memory array fabricated according to a third embodiment of the present invention.

FIG. 19 illustrates yet another embodiment of the present invention according to which the device array 300 comprises MOSFET transistors 390 which are subjected to an optional salicide process after the formation of double vertical gate electrode 335. The MOSFET transistors 390 may be formed over or within a SOI substrate (as the SOI substrate 110 described above in the first embodiment and with reference to FIGS. 2-11) or over or within a wafer substrate (as the p-type substrate 210 described above in the second embodiment and with reference to FIGS. 12-18).

For illustration purposes only, the MOSFET transistors 390 are fabricated as described above within a p-type substrate 210, in a manner similar to that for the formation of the MOSFET transistors 290 of FIG. 18. Subsequent to the formation of the device array 200 of FIG. 18, the array is subjected to another metal deposition and anneal process such as a rapid thermal anneal (RTA) for about 10 to 60 seconds using a nitrogen ambient at about 600° C. to about 850° C., to form word lines or gate electrodes 335 (FIG. 19) of metal silicides and a layer 385 that forms over all exposed silicon (including gate electrodes 335 and silicon adjacent to buried bit lines 25) (FIG. 19) preferably of cobalt silicide ($CoSi_2$), or other silicide material. The cobalt silicide formed on top of the gate stack may be formed simultaneously with the formation of the buried silicide bit lines 25 or, alternatively, after the formation of the buried silicide bit lines 25 (i.e., after gate electrode formation). Of course, the metal for the formation of the silicide gate electrode 335 must be a metal which may be converted to its silicide or a combination of such metals, for example. In this manner, the word line 335, the buried bit line 25 and the drain including layer 385 are all formed of a silicide material. As in the previously described embodiments, the word line 335 forms an angle other than a ninety degree angle (for example, an angle α (FIG. 19) of about 60 degrees) with the buried bit line 25.

FIGS. 20-29 illustrate a fourth embodiment of the present invention, according to which device array 400 (FIG. 29) comprises a plurality of DRAM cells 499, each DRAM cell 499 comprising two devices, a vertical transistor 490 and a capacitor 80 located above the transistor 490. Vertical transistor 490 of the device array 400 comprises buried bit lines 25 disposed adjacent a gate stack comprising epitaxial layers 414, 416, 418, and not doped silicon layers as in the previously-described embodiments.

Figure 20:
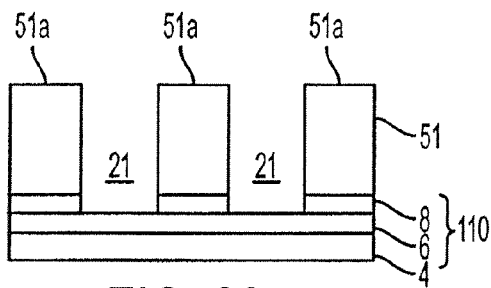
FIG. 20 is a cross-sectional view of a SOI substrate undergoing the process according to a fourth embodiment of the present invention.

FIG. 20 illustrates a SOI substrate 110 similar to that shown in FIG. 2. As in the above-described embodiments, the SOI substrate 110 may be formed by a bonding and etching back method, according to which a silicon substrate 4 is thermally oxidized to grow a layer of silicon oxide 6 with a thickness of about 1 micron. Subsequently, an n-type single crystalline silicon substrate 8 is opposed to the silicon oxide layer 6, and the silicon substrate 4, with the oxide layer 6, is then contacted with the crystalline silicon substrate 8, and the resultant structure is heated to a temperature of about 1000° C., so that the n-type crystalline silicon of the crystalline silicon substrate 8 adheres to the silicon oxide layer 6. Next, the n-type crystalline silicon substrate 8 may be polished so that its thickness may be decreased. Thus, the resultant SOI substrate 110 is formed of the silicon substrate 4, the silicon oxide layer 6, and the n-type crystalline silicon substrate 8.

Subsequent to the formation of the SOI substrate 110, a thick insulating layer 51, for example a thick oxide layer or a thick nitride layer of about 2,000 Angstroms to about 10,000 Angstroms, is formed over the SOI substrate 110 by chemical vapor deposition (CVD) or other suitable methods, for example. The insulating layer 51 may be formed via PECVD and LPCVD deposition procedures, for example, at a temperature between about 300° C. to about 1000° C. A photoresist and mask 801 (FIG. 38) are then applied over the thick insulating layer 51, and photolithographic techniques and mask 801 (FIG. 38) are used to define a set of parallel rows or columns 51a on the array surface. A directional etching process such as plasma etching or reactive ion etching (RIE) is used to etch through the insulating layer 51 and into the SOI substrate 110 to form a first set of trenches 21, as depicted in FIG. 20. Preferably, the first set of trenches extend into the crystalline silicon substrate 8 and stop on the upper surface of the silicon oxide layer 6, as shown in FIG. 20.

A conductive layer 24 of a metal capable of forming a silicide is formed over insulating columns 51a and within the first set of trenches 21 (FIG. 21) by RF or DC sputtering, or by other similar methods such as CVD, to a thickness of about 100 Angstroms to about 800 Angstroms. Subsequent to the deposition of the metal capable of forming a silicide, the substrate is subjected to a rapid thermal anneal (RTA), typically for about 10 to 60 seconds, using a nitrogen ambient at about 600° C. to about 850° C., so that the metal in direct contact with the silicon layer 8 is converted to its silicide and forms buried silicide regions 25 (FIG. 22, which are the buried bit lines 25 of the device array 400 of FIG. 29). Preferably, the metal capable of forming a silicide is a combination of cobalt/titanium nitride material that forms cobalt silicide bit line 25. However, the metal silicide may comprise any metal capable of forming a silicide, including but not limiting to cobalt, nickel, molybdenum, titanium, tungsten, tantalum, and platinum, among others, and combinations of such materials. In addition, the metal silicide may also comprise combinations of silicides doped with nitrogen, such as cobalt nitride silicide, tungsten nitride silicide, or a combination of tungsten nitride silicide/tungsten silicide, for example.

Figure 22:
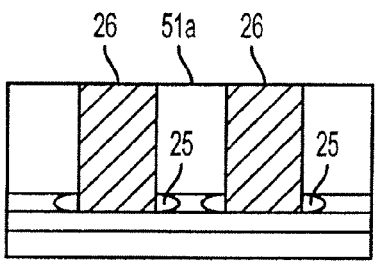
FIG. 22 shows the SOI substrate of FIG. 20 at a processing step subsequent to that shown in FIG. 21.

Subsequent to the formation of buried silicide bit lines 25, the unreacted metal is stripped and a nitride material 26 is formed within the first set of trenches 21, as shown in FIG. 22. Although nitride material is preferred, the invention also contemplates the formation of an oxide, such as silicon oxide for example, to fill in the first set of trenches 21, but must be dissimilar to the material of insulating layer 51. The device array 400 is then planarized by any suitable means, such as chemical mechanical polishing (CMP), stopping at the insulating columns 51a, and the insulating columns 51a are subsequently removed by known methods in the art to form the structure of FIG. 23.

Figure 24:
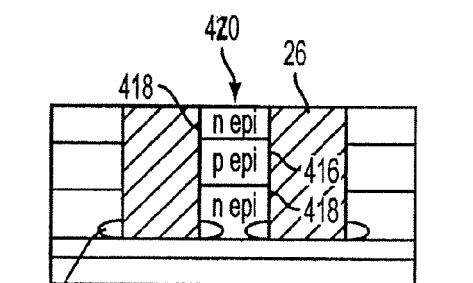
FIG. 24 shows the SOI substrate of FIG. 20 at a processing step subsequent to that shown in FIG. 23.

FIG. 24 illustrates epitaxial silicon layers 414, 416, 418 formed within trenches 21a (FIG. 23) by known methods, for example, by epitaxial growth, such as vapor phase, liquid phase, or solid phase epitaxy. For example, the first epitaxial silicon layer 414 may be grown by epitaxy in a reaction chamber at high temperatures, of about 900-1200° C., and by employing a silicon gas source that introduces a gaseous species containing silicon (Si) into the reaction chamber. As known in the art, the silicon gas source may be silane ($SiH_4$), higher order silanes, such as disilane ($Si_2H_6$), as well as other gaseous sources of silicon, such as dichlorsilane ($SiH_2Cl_2$), trichlorsilane ($SiHCl_3$), or tetrachlorsilane ($SiCl_4$), for example. In any event, the first epitaxial silicon layer 414 is grown over the SOI substrate 110 to a thickness of about 500 to about 3,000 Angstroms, preferably of about 2,000 Angstroms. Subsequent to, or during, the formation of the first epitaxial silicon layer 414, n-type dopants such as phosphorous (P), arsenic (As) or antimony (Sb) are introduced into the first epitaxial silicon layer 414 to form an n-type epitaxial silicon layer 414. A heat treatment, such as an anneal treatment at about 600° C. to about 1000° C., may be optionally employed to activate the dopant within the n+ epitaxial silicon layer 414.

Once the growth of the first epitaxial silicon layer 414 is completed, and while the SOI substrate 110 is still in the reaction chamber, a second epitaxial silicon layer 416 and a third epitaxial silicon layer 418 are sequentially formed over the first epitaxial silicon layer 414, as shown in FIG. 24, by methods similar to, or different from, those employed for the formation of the first epitaxial silicon layer 414. The second epitaxial silicon layer 416 is doped with a p-type dopant, such as boron (B), boron fluoride ($BF_2$) or indium (In), and is formed to a thickness of about 500 to about 2,000 Angstroms. The third epitaxial silicon layer 418 is doped with an n-type dopant, different from or similar to that for the formation of the n-type first epitaxial silicon layer 414, and is formed to a thickness of about 500 to about 1,500 Angstroms, preferably of about 1,000 Angstroms. A heat treatment, for example, an anneal treatment at about 600° C. to about 1000° C., may be optionally employed to activate the dopant within each of the second and third epitaxial silicon layers 416, 418.

Subsequent to the formation of epitaxial silicon layers 414, 416, 418, the formation of word lines (i.e., gate electrodes) 435 (FIG. 28) of the vertical transistors 490 (FIG. 29) proceeds according to a method described above with reference to the first embodiment and as shown in FIGS. 7-10. As such, FIGS. 25-28 correspond to FIGS. 7-10 of the first embodiment, and illustrate side-to-side cross-sectional views of the device array 400 of FIG. 29, taken along lines A-A and B-B and at an initial stage of processing, but subsequent to the formation of the silicide bit lines 25 described above. The illustrations in FIGS. 25-28 are cross-sectional views taken normal to the buried bit lines 25 but at two different locations at the array 400 (A-A) and (B-B).

Figure 25:
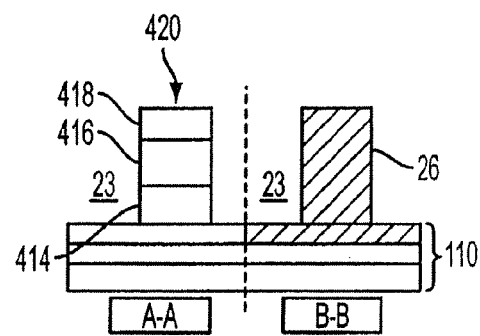
FIG. 25 shows two side-to-side cross-sectional views (A-A and B-B) of a SOI substrate of FIG. 29 undergoing the process according to the fourth embodiment of the present invention and at a processing step subsequent to that shown in FIG. 24.
Figure 21:
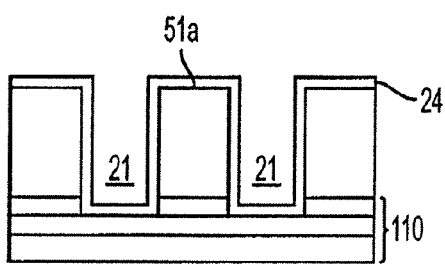
FIG. 21 shows the SOI substrate of FIG. 20 at a processing step subsequent to that shown in FIG. 20.
Figure 26:
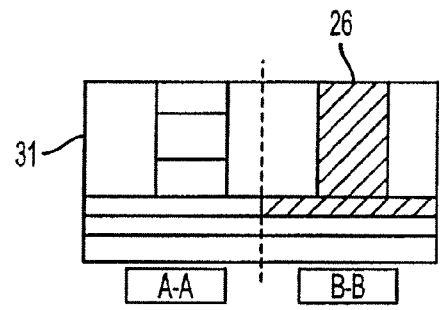
FIG. 26 shows the cross-sectional views of the SOI substrate of FIG. 25 at a processing step subsequent to that shown in FIG. 25.
Figure 27:
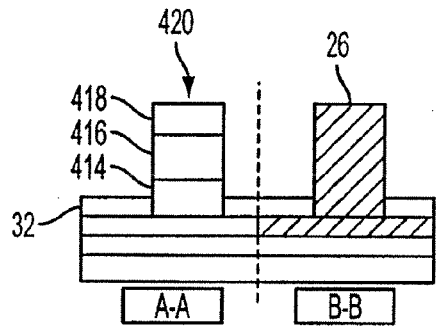
FIG. 27 shows the cross-sectional views of the SOI substrate of FIG. 25 at a processing step subsequent to that shown in FIG. 26.
Figure 23:
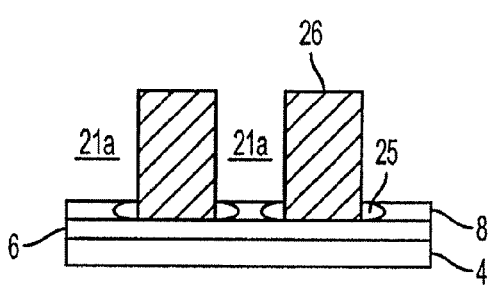
FIG. 23 shows the SOI substrate of FIG. 20 at a processing step subsequent to that shown in FIG. 22.
Figure 28:
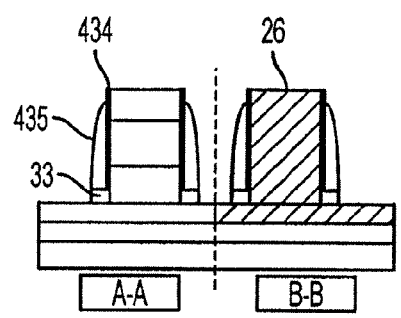
FIG. 28 shows the cross-sectional views of the SOI substrate of FIG. 25 at a processing step subsequent to that shown in FIG. 27.

FIG. 25 (A-A) illustrates gate stack 420 comprising epitaxial silicon layers 414, 416, 418 after the formation of the silicide bit lines 25 of FIG. 24. FIG. 26 illustrates the next step in the process, in which second set of trenches 23 (FIG. 25) are formed with the mask 802 of FIG. 38 and then filled with an insulating material 31, preferably an oxide material such as silicon oxide, which is etched back by known methods in the art to form oxide layer 32, as shown in FIG. 27. The height of the oxide layer 32 is tailored to allow isolation of the already-formed silicide bit lines 25 from the to-be-formed word lines 435. Subsequent to the formation of the oxide layer 32, a thin gate oxide layer 434 and a gate electrode layer 435 are sequentially formed on the sidewalls of the stacks 420, as shown in FIG. 28. The thin gate oxide layer 434, which will act as a gate insulator layer, may comprise silicon dioxide ($SiO_2$), for example, which may be thermally grown in an oxygen ambient, at a temperature between about 600° C. to about 1000° C. and to a thickness of about 10 Angstroms to about 100 Angstroms. The gate insulator is not limited to silicon oxide and other dielectric materials such as oxynitride, $Al_2O_3$, $Ta_2O_5$ or other high k material may be used as gate insulator layer.

As illustrated in FIG. 28, gate layer 435 is formed over the thin gate oxide layer 434. The gate layer 435 is formed of doped polysilicon which may be formed over the thin gate oxide layer 434 by, for example, a low plasma chemical vapor deposition (LPCVD) method at a temperature of about 300° C. to about 700° C. and to a thickness of about 100 Angstroms to about 2,000 Angstroms. An anisotropic RIE is then used to define the double gate electrode 435 non-orthogonal to the buried silicide bit lines 25. Subsequent processing steps are then applied to complete the formation of the device array 400 comprising MOSFET transistor 490. Each of the vertical transistor 490 of a particular column in the array 400 is formed of drain 418 and source 414, with double gate electrode 435 formed over the thin gate oxide 34 of each transistor 490. The gate electrode is vertical and forms an angle other than a ninety degree angle (for example, an angle α (FIG. 29) of about 60 degrees) with the buried bit line 25. The vertical gate electrode forms word line 435 which electrically connects all of the cells 499 of a given row in the array 400. Once again, capacitors are formed over the vertical transistors 490 with one electrode in contact with drain 418. Other processing steps are then carried out to interconnect the word line, bit lines and capacitors of the memory cells 499 in a memory array, as described above with reference to the first embodiment.

Figure 34:
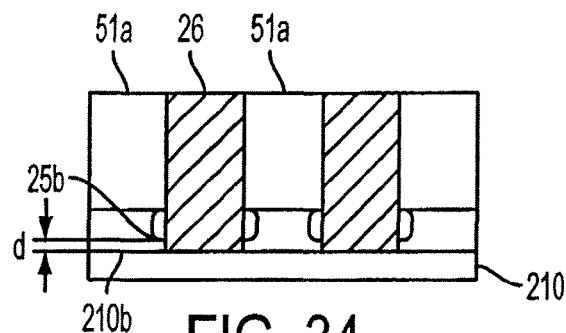
FIG. 34 shows the wafer of FIG. 30 at a processing step subsequent to that shown in FIG. 33.
Figure 31:
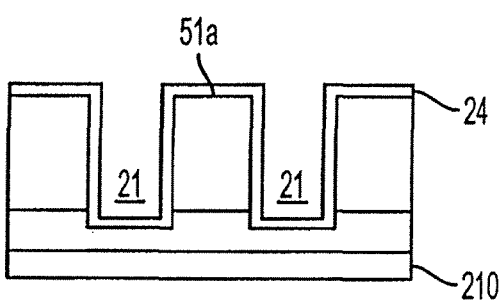
FIG. 31 shows the wafer of FIG. 30 at a processing step subsequent to that shown in FIG. 30.
Figure 35:
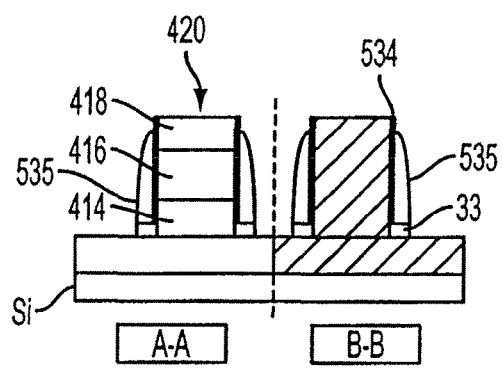
FIG. 35 shows two side-to-side cross-sectional views (A-A and B-B) of a semiconductor wafer of FIG. 36 undergoing the process according to the second embodiment of the present invention and at a processing step subsequent to that shown in FIG. 35.
Figure 32:
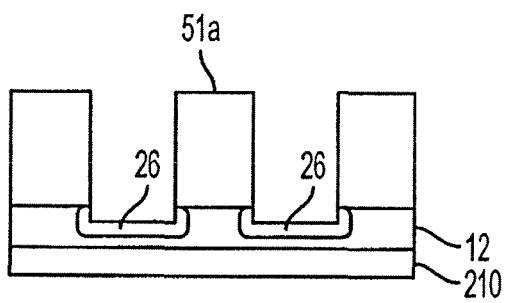
FIG. 32 shows the wafer of FIG. 30 at a processing step subsequent to that shown in FIG. 31.
Figure 33:
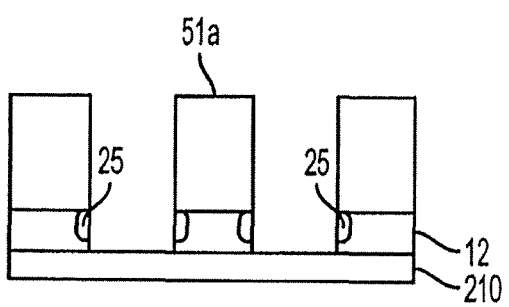
FIG. 33 shows the wafer of FIG. 30 at a processing step subsequent to that shown in FIG. 32.
Figure 36:
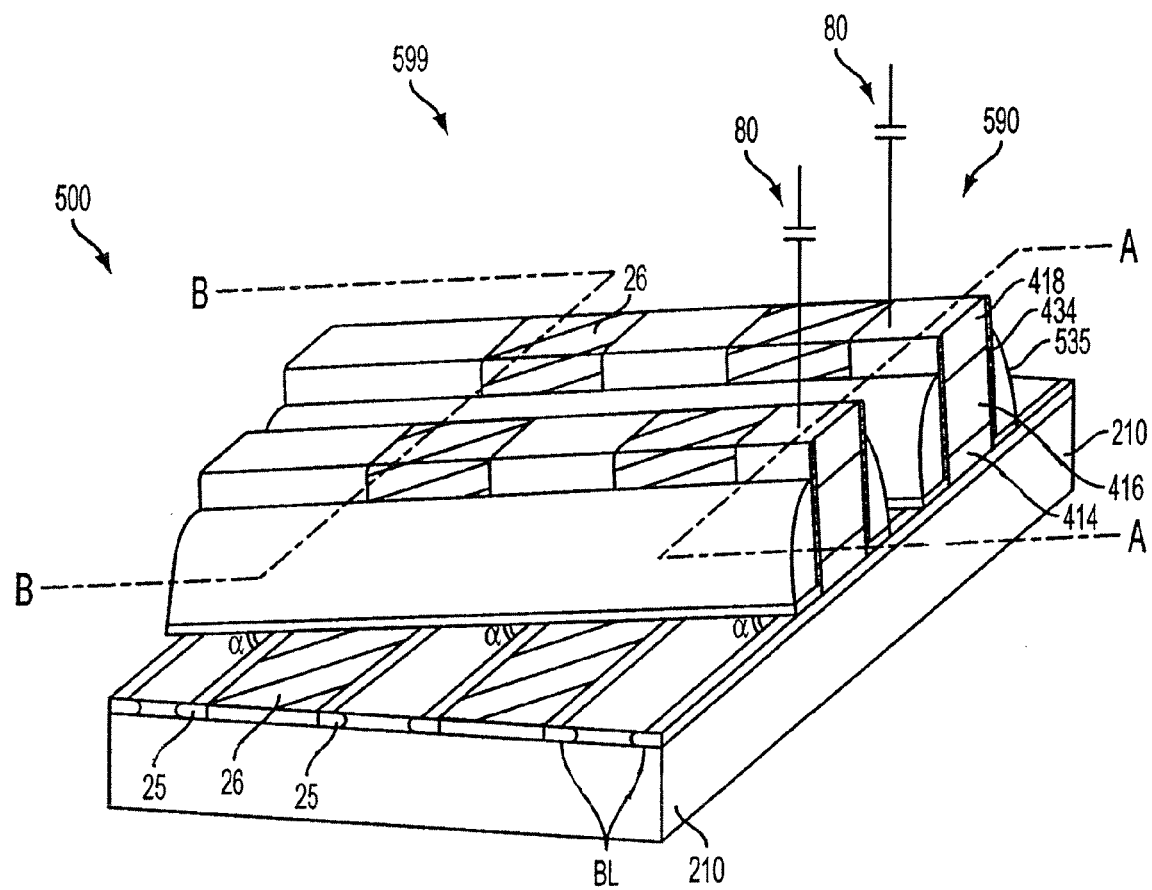
FIG. 36 is a perspective view of a memory array fabricated according to a fifth embodiment of the present invention.

FIGS. 30-36 illustrate a fifth embodiment of the present invention, according to which epitaxial silicon layers 414, 416, 418 are formed as part of stack 420 provided over a p-type silicon wafer 210, and not over a SOI substrate, such as the SOI substrate 110 described above. As in the previously-described embodiment with reference to FIGS. 20-29, epitaxial silicon layers 414, 416, 418 are formed as part of stack 420 subsequent to the formation of the silicide bit lines 25 of FIG. 33, and as part of DRAM cells 599 of device array 500 (FIG. 36).

Figure 30:
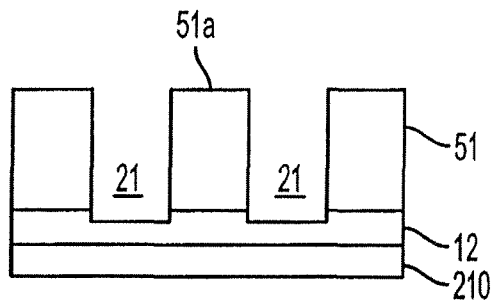
FIG. 30 is a cross-sectional view of a wafer substrate undergoing the process according to a fifth embodiment of the present invention.

Accordingly, FIG. 30 illustrates the formation of an n+ silicon layer 12 and a thick insulating layer 51 of about 2,000 Angstroms to about 10,000 Angstroms, which are formed over the p-type silicon wafer 210 by chemical vapor deposition (CVD) or other suitable methods, for example. The n+ silicon layer 12 may be also formed by appropriately doping a top portion of the p-type silicon wafer 210, as explained above with reference to the previously described embodiments. As also described in the above embodiments, the insulating layer 51 may be formed via PECVD and LPCVD deposition procedures, for example, at a temperature between about 300° C. to about 1000° C.

A photoresist and mask 801 (FIG. 38) are then applied over the thick insulating layer 51, and photolithographic techniques are used to define a set of parallel oxide rows 51a on the array surface. A directional etching process such as plasma etching or reactive ion etching (RIE) is used to etch into the n+ silicon layer 12 to form a first set of trenches 21, as depicted in FIG. 30.

A conductive layer 24 of a metal capable of forming a silicide is formed over insulating columns 51a and within the first set of trenches 21 (FIG. 31) by RF or DC sputtering, or by other similar methods such as CVD, to a thickness of about 100 Angstroms to about 800 Angstroms. Subsequent to the deposition of the metal capable of forming a silicide, the substrate is subjected to a rapid thermal anneal (RTA), typically for about 10 to 60 seconds, using a nitrogen ambient at about 600° C. to about 850° C., so that the metal in direct contact with the n+ silicon layer 12 is converted to its silicide and forms buried silicide regions 25 (which are the buried bit lines 25 of the device array 500 of FIG. 36). The metal capable of forming a silicide may be the same as, or different from, the metals capable of forming silicides described above with reference to the formation of the buried silicide regions 25 of the previous embodiments. It must be noted, however, that no silicide forms within the p-type substrate 210. Preferably, a distance "d" (FIG. 34) of about 700 Angstroms must be maintained between lower surface 25b of the buried bit lines 25 and upper surface 210b of the p-type substrate 210.

Subsequent to the formation of buried silicide bit lines 25, the unreacted metal is stripped (FIG. 33) and the silicide is etched together with the n+ silicon layer 12 down to the p-type silicon substrate 210 and a nitride material 26 is formed within the first set of trenches 21, as shown in FIG. 34. Although nitride material is preferred, the invention also contemplates the formation of an oxide, such as silicon oxide for example, to fill in the first set of trenches 21, but it must be dissimilar to the material of the insulating layer 51. The device array 500 is then planarized by any suitable means, such as chemical mechanical polishing (CMP), for example, stopping at the insulating columns 51a.

Subsequently, insulating columns 51a are removed and epitaxial silicon layers 414, 416, 418 (FIG. 35) are formed by known methods, for example, by epitaxial growth, such as vapor phase, liquid phase, or solid phase epitaxy. For example, the first epitaxial silicon layer 414 may be grown by epitaxy in a reaction chamber at high temperatures, of about 900-1200° C., and by employing a silicon gas source that introduces a gaseous species containing silicon (Si) into the reaction chamber. As known in the art, the silicon gas source may be silane ($SiH_4$), higher order silanes, such as disilane ($Si_2H_6$), as well as other gaseous sources of silicon, such as dichlorsilane (SiH$_2$Cl$_2$), trichlorsilane (SiHCl$_3$), or tetrachlorsilane (SiCl$_4$), for example. In any event, the first epitaxial silicon layer 414 is grown over the substrate 210 to a thickness of about 500 to about 3,000 Angstroms, preferably of about 2,000 Angstroms. Subsequent to, or during, the formation of the first epitaxial silicon layer 414, n-type dopants such as phosphorous (P), arsenic (As) or antimony (Sb) are introduced into the first epitaxial silicon layer 414 to form an n-type epitaxial silicon layer 414. A heat treatment, such as an anneal treatment at about 600° C. to about 1000° C., may be optionally employed to activate the dopant within the n+ epitaxial silicon layer 414.

Once the growth of the first epitaxial silicon layer 414 is completed, and while the substrate is still in the reaction chamber, a second epitaxial silicon layer 416 and a third epitaxial silicon layer 418 are sequentially formed over the first epitaxial silicon layer 414, as shown in FIG. 35, by methods similar to, or different from, those employed for the formation of the first epitaxial silicon layer 414. The second epitaxial silicon layer 416 is doped with a p-type dopant, such as boron (B), boron fluoride (BF$_2$) or indium (In), and is formed to a thickness of about 500 to about 2,000 Angstroms. The third epitaxial silicon layer 418 is doped with an n-type dopant, different from or similar to that for the formation of the n-type first epitaxial silicon layer 414, and is formed to a thickness of about 500 to about 1,500 Angstroms, preferably of about 1,000 Angstroms. A heat treatment, for example, an anneal treatment at about 600° C. to about 1000° C., may be optionally employed to activate the dopant within each of the second and third epitaxial silicon layers 416, 418.

Subsequent to the formation of epitaxial silicon layers 414, 416, 418, the formation of gate electrode lines 535 or word lines 535 (FIG. 35) of the vertical transistors 590 (FIG. 36) proceeds according to a method similar to that described above with reference to the first embodiment and as shown in FIGS. 7-10. As such, a thin gate oxide layer 534 and a gate electrode 535 are sequentially formed on the sidewalls of the stacks 420, as shown in FIG. 35. The thin gate oxide layer 534, which will act as a gate insulator layer, may comprise silicon dioxide (SiO$_2$), for example, which may be thermally grown in an oxygen ambient, at a temperature between about 600° C. to about 1000° C. and to a thickness of about 10 Angstroms to about 100 Angstroms. The gate insulator is not limited to silicon oxide and other dielectric materials such as oxynitride, Al$_2$O$_3$, Ta$_2$O$_5$ or other high k material may be used as gate insulator layer.

Vertical double gate electrode 535 is formed over the thin gate oxide layer 534 and is non-orthogonal to the buried silicide bit lines 25. Subsequent processing steps are then applied to complete the formation of the device array 500 comprising MOSFET transistors 590 (FIG. 36). Each of the vertical transistor 590 of a particular column in the array 500 is formed of drain 418 and source 414, with double gate electrode 535 formed over the thin gate oxide 534 of each transistor 590. The gate electrode is vertical and non-orthogonal to the buried bit line 25. The vertical gate electrode forms word line 535 which electrically connects all of the cells 599 of a given row in the array 500. Subsequent processing steps are then carried out to interconnect the word lines, the bit lines and capacitors of the memory cells 599 in a memory array, as described above with reference to the first embodiment.

Figure 29:
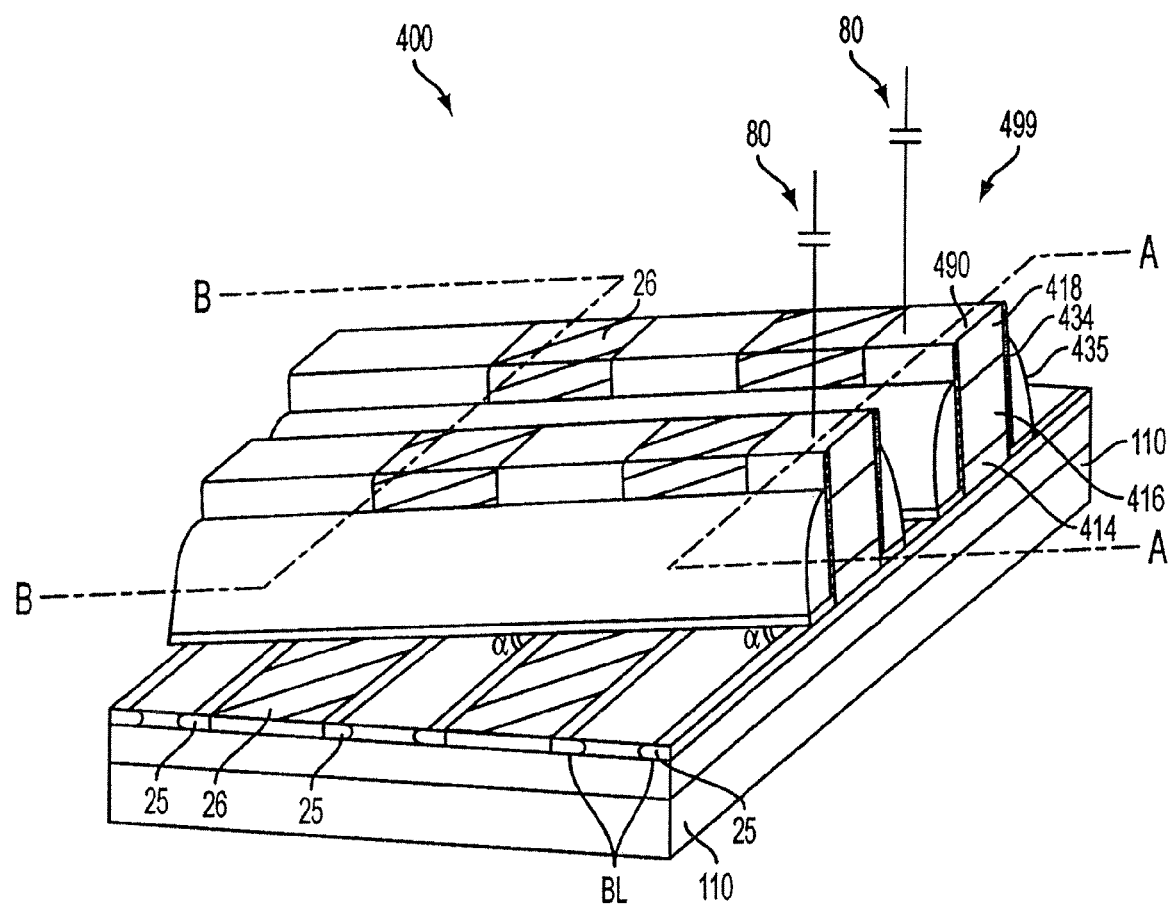
FIG. 29 is a perspective view of a memory array fabricated according to a fourth embodiment of the present invention.
Figure 37:
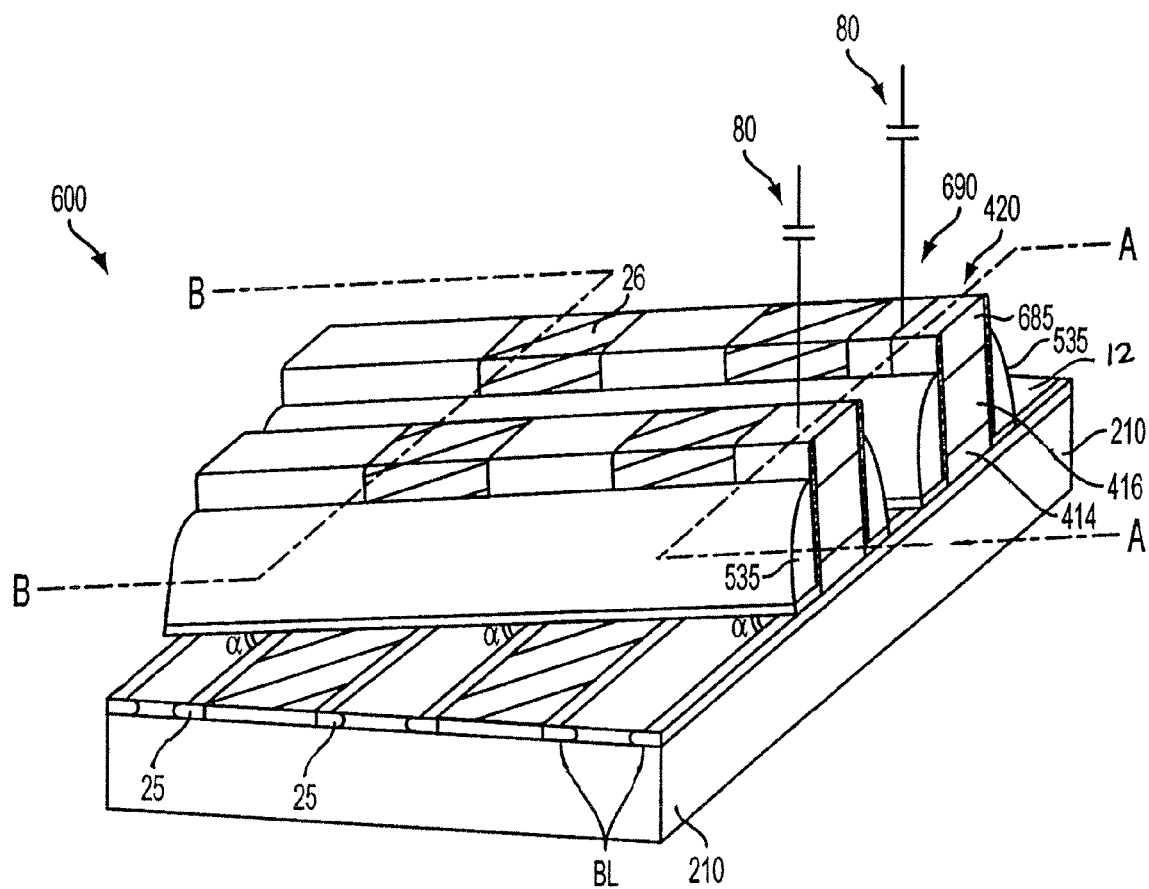
FIG. 37 is a perspective view of a memory array fabricated according to a sixth embodiment of the present invention.

FIG. 37 illustrates yet another embodiment of the present invention according to which the device array 600 comprises MOSFET transistors 690 which are subjected to an optional salicide process after the formation of the vertical gate electrode 435, 535 (FIGS. 29 and 36). The MOSFET transistors 690 may be formed over a SOI substrate (as the SOI substrate 110 described above with reference to FIGS. 20-29) or over a p-type substrate (as the p+ substrate 210 described above with reference to FIGS. 30-36) and comprises epitaxial silicon layers 414, 416, 418 formed as part of stack 420 and as described in detail above. For illustration purposes only, the MOSFET transistors 690 are fabricated as described above over a p-type substrate 210, in a manner similar to that for the formation of the MOSFET transistors 590 of FIG. 36. Subsequent to the formation of the device array 500 of FIG. 36, the array 600 is subjected to another metal deposition and anneal process such as a rapid thermal anneal (RTA) for about 10 to 60 seconds using a nitrogen ambient at about 600° C. to about 850° C., to form gate electrodes 535 of metal silicides and a silicide layer 685 (that forms over all exposed silicon (including gate electrodes 535 and silicon adjacent to buried bit lines 25)) preferably of cobalt silicide (CoSi$_2$), or other silicide material. The cobalt silicide formed on top of the stack 420 may be formed simultaneously with the formation of the buried silicide bit lines 25 or, alternatively, after the formation of the buried silicide bit lines 25 (i.e., after gate electrode formation). Of course, the metal for the formation of the silicide gate electrode 535 must be a metal which may be converted to its silicide or a combination of such metals, for example. In this manner, the word line 535 (which is non-orthogonal to the buried line 25), the buried bit line 25 and the drain including layer 685 are all formed of a silicide material.

FIG. 38 illustrates a die setup 800 comprising at least two masks 801, 802 which are employed for the formation of the device arrays described above, wherein at least one buried bit line and at least one double vertical gate electrode of the arrays described above are formed at an angle "a" which is different than a ninety degree angle.

Figure 39:
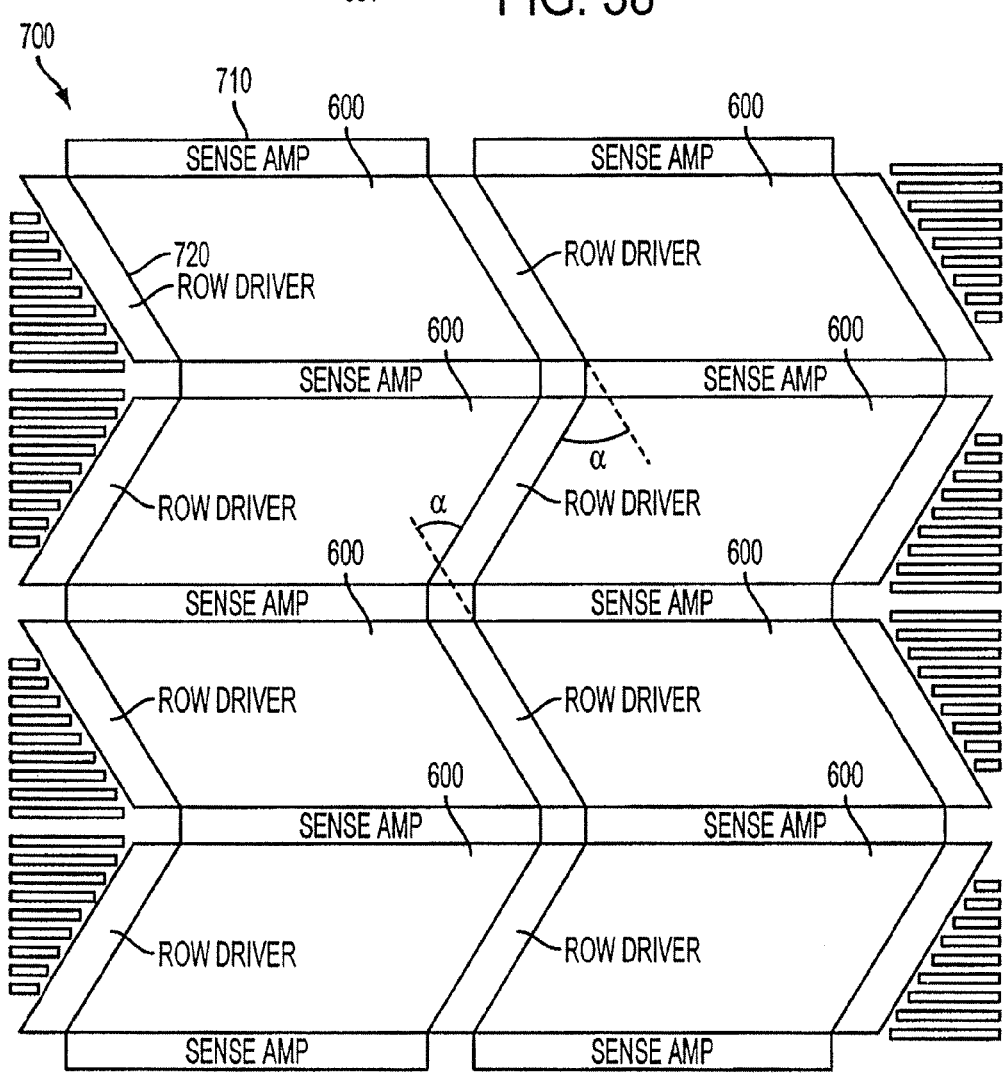
FIG. 39 is a top view of a memory array including eight islands of the memory arrays fabricated according to the embodiments of the present invention.

FIG. 39 illustrates a schematic top view of eight memory arrays described above and formed according to embodiments of the present invention incorporated with sense amplifiers 710 and row drivers 720. For exemplary purposes only, FIG. 39 illustrate device array 700 including eight memory arrays 600, described above with reference to FIG. 37, and incorporated with sense amplifiers 710 and row drivers 720.

Figure 40A:
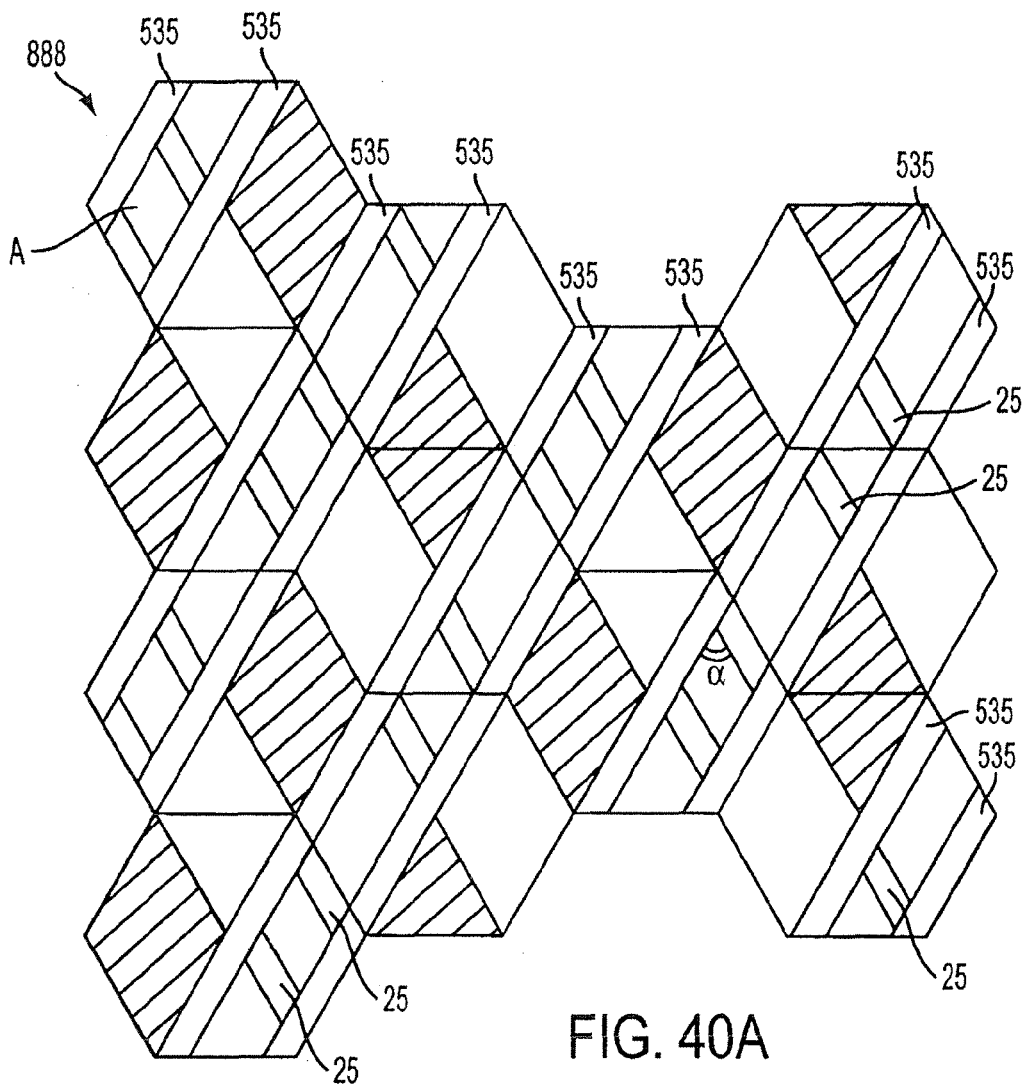
FIGS. 40(a) and (b) are partial top views of a hexagonal layout of the memory array of FIG. 36.

FIGS. 40(a) and (b) illustrate partial top views of the device array 600 of FIG. 37 showing the formation of the buried bit lines 25 and of the double vertical gate electrode 535 at an angle α of about 60 degrees and as part of a "honeycomb" or hexagonally shaped layout 888.

Figure 40B:
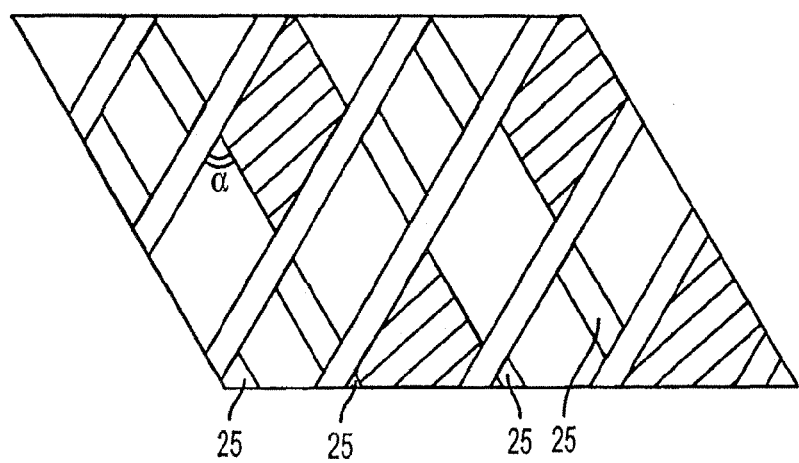
Figure 41A:
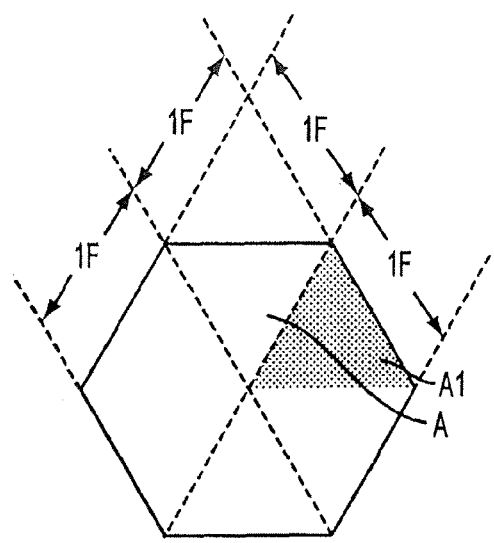
FIG. 41(a) is a partial top view of one hexagonal unit cell.
Figure 41B:
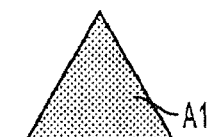
FIG. 41(b) is a partial top view of a single triangle of the hexagonal layout of the memory array of FIG. 41(a).
Figure 41C:
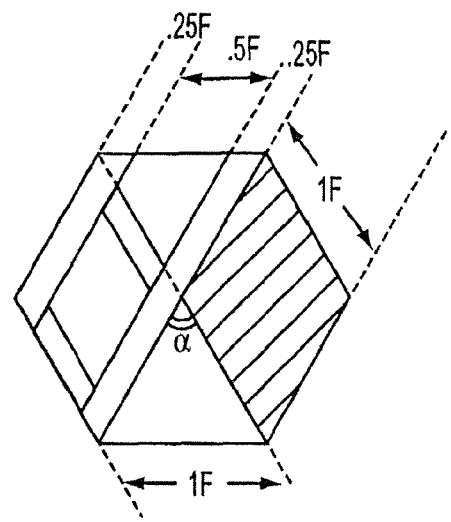
FIG. 41(c) is another top view of the hexagonal unit cell of FIG. 41(a).
Figure 42:
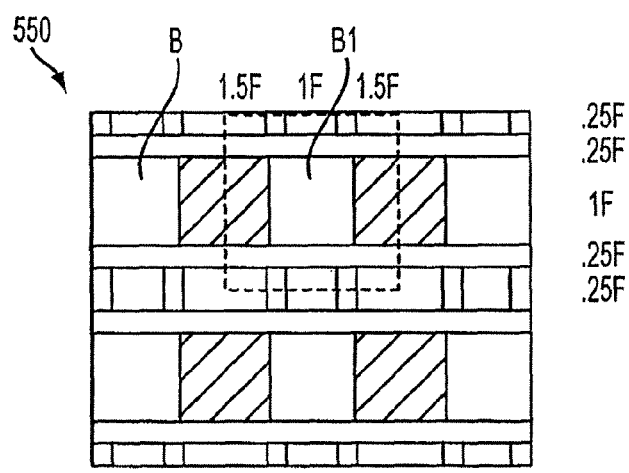
FIG. 42 is a partial top view of a square layout of a memory cell.

FIGS. 41 and 42 illustrate a side-by-side comparison of a hexagonal unit A (FIG. 41(a)) of the hexagonally shaped layout 888 (or "honeycomb" layout) of FIG. 40 and of a square unit B of a squarely shaped layout. As illustrated in FIG. 41(b), the area of a single triangle A$_1$ of the hexagonal unit of FIG. 41(a) is of about 0.5774 F$^2$, where F is the minimum lithographic feature size. Accordingly, the area of the hexagon unit A of FIGS. 41(a) and 41(c) is (6×0.5774 F$^2$) or about 3.464 F$^2$. In contrast, the area of the single square B$_1$ of the squarely shaped layout of FIG. 42 is about 4 F$^2$.

The difference in the sizes of the hexagonal unit A and of the square unit B demonstrates that, by employing the buried bit line and the word line of the DRAM cells of the previously-described embodiments at an angle other than a ninety degree angle, the 4 F$^2$ cell size of a square layout becomes a 3.464 F$^2$ DRAM cell size corresponding to the hexagonal layout. This, in turn, reduces the cell size by about 13.4% (and the array area savings by about 13.4%). In addition, employing a hexagonal layout in lieu of a square layout allows a larger landing pad (of about 15.5% larger) for a capacitor of a hexagonal layout. This is because the landing pad for a square layout is of about 1 $F^2$ while the landing pad for a hexagonal layout is 1.155 $F^2$.

Further, the width of a FET formed by employing the honeycomb layout of the present invention is about 15.47% larger for each gate (and about 31% for double gate electrode). The bit line to bit line cross talk in the device array 700 (FIG. 39) is also reduced, as the average separation between two adjacent buried bit lines of the hexagonal array 700 is of about 0.539 F, compared to the 0.5 F average separation between two adjacent buried bit lines of a square array. Moreover, the word line to word line cross talk in the device array 700 is also reduced, as the average separation between two adjacent word lines of the hexagonal array 700 is of about 1.077 F, compared to the 1 F average separation between two adjacent word lines of a square array.

Although the above embodiments have been described with reference to the formation of NMOS vertical transistors having at least a double buried bit line forming an angle other than a 90 degree angle with at least a double vertical gate electrode, it must be understood that the invention is not limited to this embodiment. Accordingly, the invention also contemplates the formation of PMOS transistors, as well as the formation of a plurality of MOS transistors of the same or different conductivity type. Thus, the above illustrated and described embodiments are only exemplary, and the present invention is not limited to the illustrated embodiments.

Figure 43:
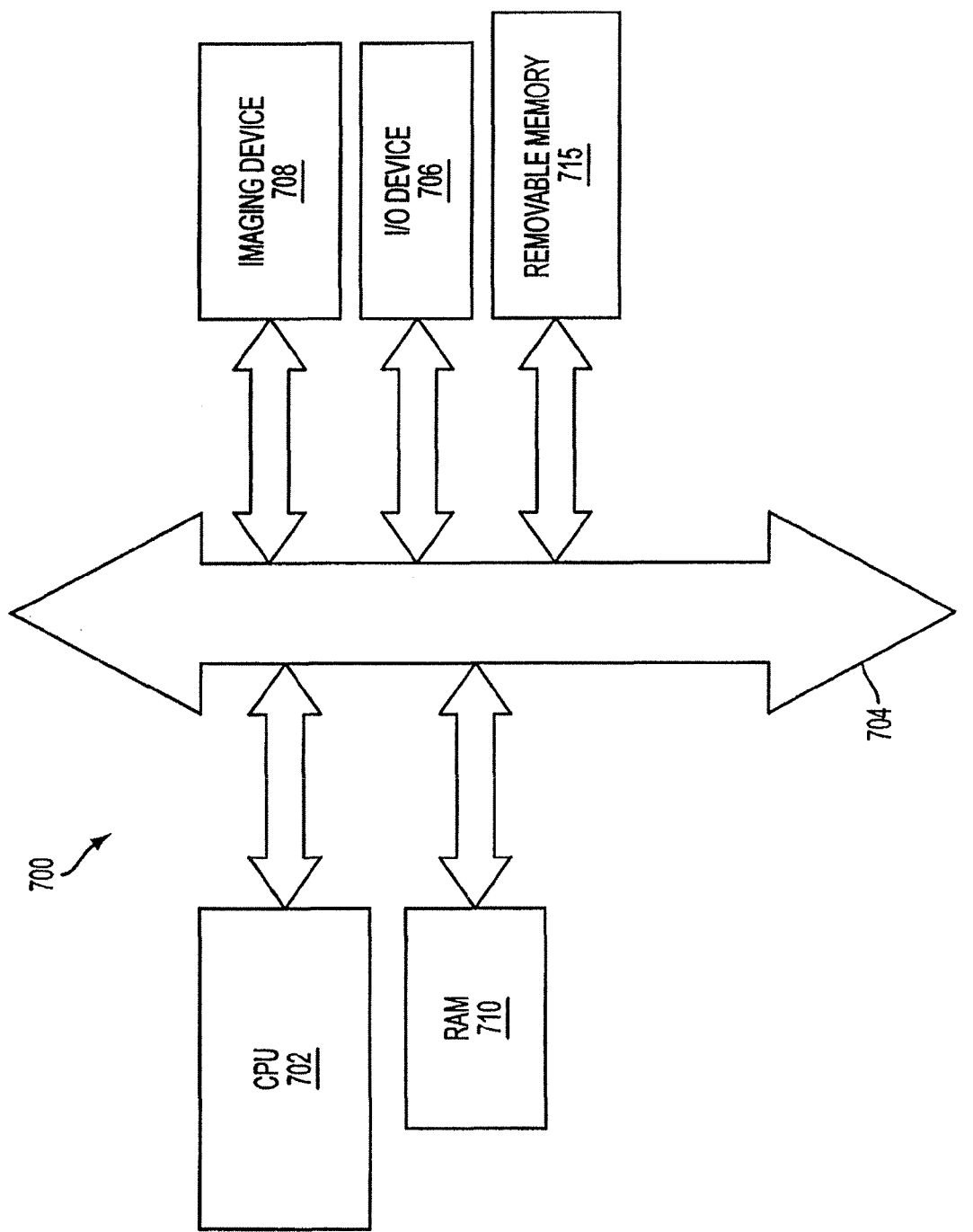
FIG. 43 illustrates a schematic diagram of a computer processor system which may utilize an imaging device, for example, a CMOS imaging device having a memory array fabricated according to methods of the present invention.

FIG. 43 illustrates system 700, a typical processor system modified to include an imaging device 708 comprising at least a DRAM cell having an area less than 4 $F^2$, more preferably of about 3.464 $F^2$ and constructed in accordance with an embodiment of the invention (e.g., DRAM cell 99 of FIG. 11). The processor-based system 700 is exemplary of a system having digital circuits that could include image sensor devices. Without being limiting, such a system could include a computer system, camera system, scanner, machine vision, vehicle navigation, video phone, surveillance system, auto focus system, star tracker system, motion detection system, image stabilization system, and data compression system.

System 700, for example a camera system, generally comprises a central processing unit (CPU) 702, such as a microprocessor, that communicates with an input/output (I/O) device 706 over a bus 704. Imaging device 708 also communicates with the CPU 702 over the bus 704. The processor-based system 700 also includes random access memory (RAM) 710, and can include removable memory 715, such as flash memory, which also communicate with the CPU 702 over the bus 704. The imaging device 708 may be combined with a processor, such as a CPU, digital signal processor, or microprocessor, with or without memory storage on a single integrated circuit or on a different chip than the processor.

In addition, although the formation of n+, p−, n+ regions or device layers 12, 14, 16 has been described above with reference to the doping of a SOI substrate (such as SOI substrate 110) or of a silicon substrate (such as p-type silicon substrate 210), the invention is not limited to these embodiments and also contemplates the formation of device layers 12, 14, 16 by other known methods in the art. For example, device layers 12, 14, 16 may be doped silicon or doped polysilicon layers formed over a SOI substrate or over a silicon substrate, or partially within a SOI substrate or a silicon substrate. In these embodiments, the n+, p−, n+ regions or device layers 12, 14, 16 may be formed by deposition methods, for example, by CVD, PECVD or LPCVD, among others, or by other known methods of the art. Accordingly, the embodiments described above with reference to the formation of n+, p−, n+ regions or device layers 12, 14, 16 by doping or implanting predefined regions of a SOI substrate or of a p-type silicon substrate are only exemplary, and the invention is not limited to these exemplary embodiments.

Further, although the above embodiments have been described with reference to the formation of vertical transistors having at least a double buried bit line and at least a double vertical gate electrode that are non-orthogonal relative to each other, it must be understood that the invention is not limited to these embodiments. Accordingly, the invention also contemplates the formation of vertical transistors having only one buried bit line formed by the embodiments described above. The invention also contemplates embodiments in which the buried bit line of the vertical transistor is at least partially buried and not completely buried, as described in the embodiments above. Further, the invention does not contemplate embodiments where only pairs of bit lines or pairs of gates are formed associated with each vertical transistor. Thus, the invention could be adapted for use to form one bit line and one vertical gate per transistor.

The above description illustrates preferred embodiments that achieve the features and advantages of the present invention. It is not intended that the present invention be limited to the illustrated embodiments. Modifications and substitutions to specific process conditions and structures can be made without departing from the spirit and scope of the present invention. Accordingly, the invention is not to be considered as being limited by the foregoing description and drawings, but is only limited by the scope of the appended claims.

What is claimed as new and desired to be protected by Letters Patent of the United States is:

1. A memory cell comprising:
 a vertical transistor having a first doped region formed at least partially within a substrate, a second doped region formed on the first doped region, and a third doped region formed on the second doped region;
 a buried bit line located below a surface of the substrate and in contact with the first doped region, the buried bit line comprising a silicide material;
 a conductive word line located on sidewalls of the vertical transistor, the conductive word line forming an angle other than a ninety degree angle with the buried bit line;
 a capacitor located above the vertical transistor and having one electrode in electrical contact with the third coped region; and
 a silicide layer covering the vertical transistor.

2. The memory cell of claim 1, wherein the substrate is a silicon-on-insulator substrate.

3. The memory cell of claim 1, wherein the substrate is a silicon substrate.

4. The memory cell of claim 1, wherein the first, second and third doped regions are silicon doped regions, the first and second silicon doped regions being doped to a second conductivity type, and the second doped silicon region being doped to a first conductivity type.

5. The memory cell of claim 1, where the silicide layer comprises cobalt silicide.

6. The memory cell of claim 1, wherein the first, second and third doped regions are epitaxial silicon regions, the first and second epitaxial silicon regions being doped to a second conductivity type, and the second epitaxial silicon region being doped to a first conductivity type.

7. A semiconductor memory array comprising:
 a substrate;
 a plurality of memory cells arranged as an array of rows and columns, each memory cell comprises a vertical transistor having first, second and third conductive regions located below a surface of the substrate, the third conductive region of the vertical transistor contacts a capacitor, and at least one of the plurality of memory cells has an area of less than 4 $F^2$, where F is the minimum lithographic feature size;

a plurality of bit lines located below the surface of the substrate, wherein each bit line is located fully below and in contact with the first conductive region of each vertical transistor in a respective column;

a gate oxide layer located on each of a first and a second vertical sides of the vertical transistor; and a plurality of word lines, wherein each word line adjoins the second conductive region of each vertical transistor in a respective row on each of the first and second vertical sides, and wherein each word line is separated from the second conductive region by the gate oxide layer.

8. The memory array of claim 7, wherein the at least one of the plurality of memory cells has an area of about 3.464 $F^2$, where F is the minimum lithographic feature size.

9. The memory array of claim 7, wherein the first, second and third regions of the vertical transistor are doped silicon regions, wherein the first and the third conductive regions are doped to a second conductivity type, and the second conductive region is doped to a first conductivity type.

10. The memory array of claim 7, further comprising a silicide layer over the vertical transistor.

11. The memory array of claim 10, wherein the silicide layer comprises cobalt silicide.

12. A semiconductor memory array comprising:
a substrate;
a plurality of memory cells arranged as an array of rows and columns, wherein at least one of the memory cells comprises a vertical transistor having first, second and third regions located below a surface of the substrate, the third region of the vertical transistor contacts a capacitor, and the at least one of the memory cells has an area of about 3.464 $F^2$, where F is the minimum lithographic feature size;
a buried bit line located below the surface of the substrate, the buried bit line being located fully below and in contact with the first region of the vertical transistor in a respective column;
a gate oxide layer located on each of a first and a second vertical sides of the vertical transistor; and
a word line adjoining the second region of the vertical transistor in a respective row on each of the first and second vertical sides, the word line being separated from the second region by the gate oxide layer.

13. The memory array of claim 12, wherein the buried bit line comprises a silicide material.

14. The memory array of claim 12, wherein at least one of the plurality of memory cells is a DRAM memory cell.

15. The memory array of claim 12, further comprising a silicide layer over the vertical transistor.

16. The memory array of claim 15, wherein the silicide layer comprises cobalt silicide.

* * * * *

UNITED STATES PATENT AND TRADEMARK OFFICE
CERTIFICATE OF CORRECTION

| | | |
|---|---|---|
| PATENT NO. | : 7,968,928 B2 | Page 1 of 1 |
| APPLICATION NO. | : 12/076766 | |
| DATED | : June 28, 2011 | |
| INVENTOR(S) | : Todd R. Abbott | |

It is certified that error appears in the above-identified patent and that said Letters Patent is hereby corrected as shown below:

In column 18, line 43, in Claim 1, delete "coped" and insert -- doped --, therefor.

Signed and Sealed this
Thirteenth Day of September, 2011

David J. Kappos
*Director of the United States Patent and Trademark Office*